(12) United States Patent
Hsieh

(10) Patent No.: US 10,593,655 B2
(45) Date of Patent: Mar. 17, 2020

(54) LIGHT BULB

(71) Applicant: EPISTAR CORPORATION, Hsinchu (TW)

(72) Inventor: Min Hsun Hsieh, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 16/436,445

(22) Filed: Jun. 10, 2019

(65) Prior Publication Data

US 2019/0295995 A1 Sep. 26, 2019

Related U.S. Application Data

(63) Continuation of application No. 16/110,293, filed on Aug. 23, 2018, now Pat. No. 10,319,703, which is a continuation of application No. 15/730,323, filed on Oct. 11, 2017, now Pat. No. 10,083,945, which is a continuation of application No. 14/933,816, filed on
(Continued)

(51) Int. Cl.
| | |
|---|---|
| *H01L 25/075* | (2006.01) |
| *H01L 23/00* | (2006.01) |
| *F21K 9/232* | (2016.01) |
| *H01L 33/50* | (2010.01) |
| *F21V 3/00* | (2015.01) |
| *F21W 121/00* | (2006.01) |
| *F21Y 115/10* | (2016.01) |
| *F21Y 107/00* | (2016.01) |
| *H01L 33/38* | (2010.01) |
| *H01L 33/44* | (2010.01) |
| *H01L 33/62* | (2010.01) |

(52) U.S. Cl.
CPC .......... *H01L 25/0753* (2013.01); *F21K 9/232* (2016.08); *H01L 24/24* (2013.01); *H01L 24/82* (2013.01); *H01L 33/50* (2013.01); *H01L 33/504* (2013.01); *H01L 33/507* (2013.01); *F21V 3/00* (2013.01); *F21W 2121/00* (2013.01); *F21Y 2107/00* (2016.08); *F21Y 2115/10* (2016.08); *H01L 33/385* (2013.01); *H01L 33/44* (2013.01); *H01L 33/62* (2013.01); *H01L 2224/04105* (2013.01); *H01L 2224/13* (2013.01); *H01L 2224/24137* (2013.01); *H01L 2924/12041* (2013.01)

(58) Field of Classification Search
CPC .................................................. H01L 25/0753
USPC ........................................................ 257/88
See application file for complete search history.

(56) References Cited

U.S. PATENT DOCUMENTS

| | | | |
|---|---|---|---|
| 5,928,793 A | 7/1999 | Kimura | |
| 6,039,631 A | 3/2000 | Sato | |
| (Continued) | | | |

FOREIGN PATENT DOCUMENTS

| | | |
|---|---|---|
| CN | 101504938 | 8/2009 |
| CN | 201514954 | 6/2010 |
| (Continued) | | |

*Primary Examiner* — Jami Valentine Miller
(74) *Attorney, Agent, or Firm* — Muncy, Geissler, Olds & Lowe, P.C.

(57) ABSTRACT

A light-emitting device of an embodiment of the present application comprises light-emitting units; a transparent structure having cavities configured to accommodate at least one of the light-emitting units; and a conductive element connecting at least two of the light-emitting units.

20 Claims, 32 Drawing Sheets

Related U.S. Application Data

Nov. 5, 2015, now Pat. No. 9,825,012, which is a continuation of application No. 13/743,030, filed on Jan. 16, 2013, now abandoned.

(60) Provisional application No. 61/694,410, filed on Aug. 29, 2012, provisional application No. 61/683,295, filed on Aug. 15, 2012.

(56) References Cited

U.S. PATENT DOCUMENTS

| | | | |
|---|---|---|---|
| 7,625,099 B2 | 12/2009 | Newton et al. | |
| 7,709,849 B1 | 5/2010 | Kal | |
| 7,932,523 B2 | 4/2011 | Yatsuda | |
| 8,075,151 B2 | 12/2011 | Ito et al. | |
| 8,115,370 B2 | 2/2012 | Huang | |
| 9,261,246 B2 | 2/2016 | Ogata et al. | |
| 2003/0094605 A1* | 5/2003 | Preston | H01L 33/385 257/20 |
| 2006/0147346 A1 | 7/2006 | Bouten et al. | |
| 2007/0177075 A1 | 8/2007 | Kimoto | |
| 2008/0123355 A1 | 5/2008 | Wuu et al. | |
| 2009/0085052 A1 | 4/2009 | Ko | |
| 2009/0108286 A1 | 4/2009 | Lin et al. | |
| 2009/0114928 A1 | 5/2009 | Messere | |
| 2009/0224266 A1 | 9/2009 | Wang et al. | |
| 2010/0002414 A1 | 1/2010 | Meir et al. | |
| 2010/0151604 A1 | 6/2010 | Kal et al. | |
| 2010/0171133 A1 | 7/2010 | Yanashima et al. | |
| 2010/0171215 A1 | 7/2010 | Fischer et al. | |
| 2010/0314639 A1 | 12/2010 | Taniguchi et al. | |
| 2010/0317132 A1 | 12/2010 | Rogers et al. | |
| 2011/0019433 A1 | 1/2011 | Dussault | |
| 2011/0025190 A1 | 2/2011 | Jagt | |
| 2011/0050073 A1 | 3/2011 | Huang | |
| 2011/0169040 A1 | 7/2011 | Seo | |
| 2011/0175131 A1 | 7/2011 | Seo | |
| 2011/0182775 A1 | 7/2011 | Kitamura | |
| 2011/0193479 A1 | 8/2011 | Nilssen et al. | |
| 2011/0204390 A1 | 8/2011 | Lerman et al. | |
| 2011/0220871 A1 | 9/2011 | Kamikawa | |
| 2011/0227111 A1 | 9/2011 | Choi | |
| 2011/0262504 A1 | 10/2011 | Deleersnyder | |
| 2011/0291145 A1 | 12/2011 | Han et al. | |
| 2011/0297979 A1* | 12/2011 | Diana | H01L 33/385 257/91 |
| 2011/0316006 A1 | 12/2011 | Xu | |
| 2012/0056217 A1 | 3/2012 | Jung et al. | |
| 2012/0086023 A1 | 4/2012 | Veerasamy | |
| 2012/0106125 A1 | 5/2012 | Yototani et al. | |
| 2012/0193578 A1 | 8/2012 | Pan | |
| 2012/0248497 A1 | 10/2012 | Zhou et al. | |
| 2013/0120990 A1 | 5/2013 | Wu et al. | |
| 2014/0346532 A1* | 11/2014 | Kim | H01L 27/15 257/84 |

FOREIGN PATENT DOCUMENTS

| | | |
|---|---|---|
| CN | 101809765 A | 8/2010 |
| CN | 201601149 U | 10/2010 |
| CN | 102074645 A | 5/2011 |
| CN | 201973530 U | 9/2011 |
| CN | 201973530 U | 9/2011 |
| CN | 102330906 A | 1/2012 |
| CN | 102437276 A | 5/2012 |
| DE | 102008012844 A1 | 6/2009 |
| DE | 102009060759 A1 | 7/2011 |
| JP | 5-016400 | 3/1993 |
| JP | 10-319877 | 12/1998 |
| JP | 2002157914 A | 5/2002 |
| JP | 2002-261335 A | 9/2002 |
| JP | 2004-106512 A | 4/2004 |
| JP | 2005-302889 A | 10/2005 |
| JP | 2007-523472 A | 8/2007 |
| JP | 2009-188207 | 8/2009 |
| JP | 2010199105 A | 9/2010 |
| JP | 2010199105 A | 9/2010 |
| JP | 2011070971 | 4/2011 |
| JP | 2011082074 A | 4/2011 |
| JP | 2011-129661 | 6/2011 |
| JP | 2012-028232 | 2/2012 |
| JP | 2012-151078 | 8/2012 |
| TW | I398026 B1 | 6/2013 |
| WO | WO-2004/019422 A1 | 3/2004 |
| WO | WO-2011/002208 A2 | 1/2011 |
| WO | WO-2011/080058 A1 | 7/2011 |
| WO | WO-2011/098135 A1 | 8/2011 |
| WO | WO-2012016525 A1 | 2/2012 |
| WO | WO-2012/090966 A1 | 7/2012 |

* cited by examiner

LIGHT BULB

CROSS REFERENCE TO RELATED APPLICATIONS

This application is a Continuation of co-pending application Ser. No. 16/110,293, filed on Aug. 23, 2018, which is a Continuation of co-pending application Ser. No. 15/730,323 filed Oct. 11, 2017, which is a Continuation of application Ser. No. 14/933,816 filed Nov. 5, 2015, now issued, which is a Continuation of application Ser. No. 13/743,030, filed on Jan. 16, 2013, now abandoned, for which priority is claimed under 35 U.S.C. § 120; and this application claims priority of U.S. Provisional Application No. 61/694,410 filed on Aug. 29, 2012, and U.S. Provisional Application No. 61/683,295 filed on Aug. 15, 2012 under 35 U.S.C. § 119(e), the entire contents of all of which are hereby incorporated by reference.

BACKGROUND OF THE INVENTION

Field of the Invention

The application relates to a light-emitting device, and more particularly, to a light-emitting device having light-emitting units and a transparent structure having cavities configured to accommodate at least one of the light-emitting units.

Brief Description of Related Art

Incandescent lamps are commonly used as light sources for both residential and commercial facilities. However, incandescent lamps are inefficient because 90% of the input energy is lost primarily in the form of heat or infrared energy. Compact fluorescent lamps (CFL) are alternative to incandescent lamps. CFL is more effective at converting electricity into light, but it contains toxic materials which lead to environmental pollution. One solution to improve the efficiency of lamps is to use solid state devices such as light-emitting diode (LED) to produce the light.

The light-emitting diode (LED) is a solid state semiconductor device. A structure of the light-emitting diode (LED) comprises a p-type semiconductor layer, an n-type semiconductor layer, and a light-emitting layer. The light-emitting layer is formed between the p-type semiconductor layer and the n-type semiconductor layer. The structure of the LED generally comprises III-V group compound semiconductor such as gallium phosphide, gallium arsenide, or gallium nitride. The light-emitting principle of the LED is the transformation of electrical energy to optical energy by applying electrical current to the p-n junction to generate electrons and holes. Then, the LED emits light when the electrons and the holes combine.

SUMMARY OF THE INVENTION

A light-emitting device of an embodiment of the present application comprises light-emitting units; a transparent structure having cavities configured to accommodate at least one of the light-emitting units; and a conductive element connecting at least two of the light-emitting units.

DETAILED DESCRIPTION OF THE PREFERRED EMBODIMENTS

Figure 1A:
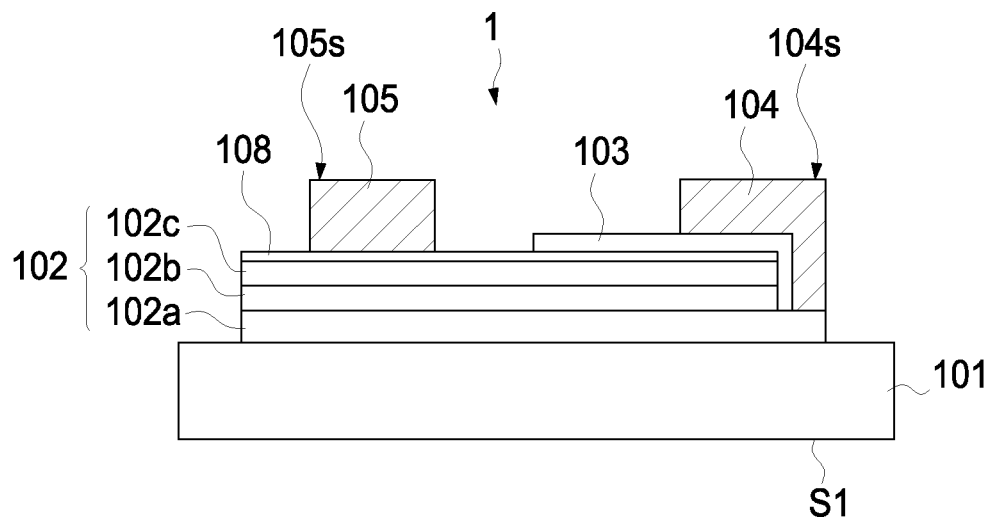
FIG. 1A illustrates a cross-sectional view of an optoelectronic unit disclosed in one embodiment of the present application.

The embodiment of the application is illustrated in detail, and is plotted in the drawings. The same or the similar part is illustrated in the drawings and the specification with the same number.

Figure 1B:
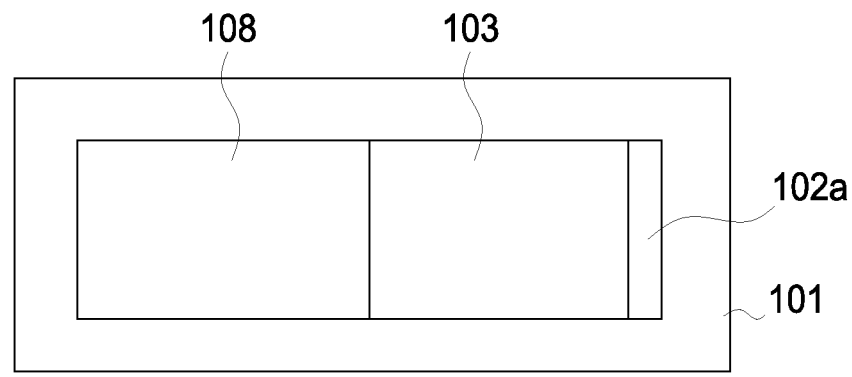
FIG. 1B illustrates a top view of the optoelectronic unit of FIG. 1A without showing a bonding pad.
Figure 1C:
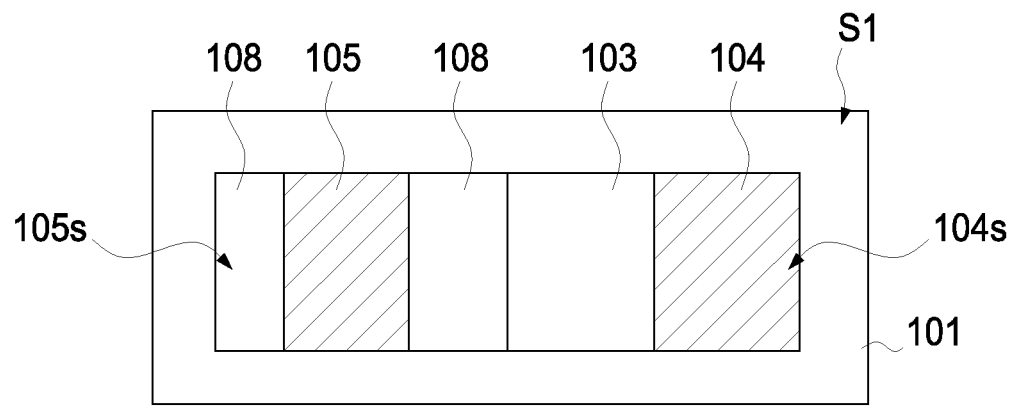
FIG. 1C illustrates a top view of the optoelectronic unit of FIG. 1A.

FIG. 1A illustrates a cross-sectional view of an optoelectronic unit 1 disclosed in one embodiment of the present application. The optoelectronic unit 1 has a bottom surface S1 with an area smaller than 50 mil$^2$, for example, the area is about 4 mil×6 mil or 2 mil×5 mil. The optoelectronic unit 1 includes a substrate 101 and a light-emitting structure 102 formed on the substrate 101. The light-emitting structure 102 includes a first semiconductor layer 102a having a first conductivity type; a second semiconductor layer 102c having a second conductivity type; and a light-emitting layer 102b formed between the first semiconductor layer 102a and the second semiconductor layer 102c. The material of the light-emitting structure 102 comprises III-V group semiconductor material. Depending on the material of the light-emitting layer 102b, the optoelectronic unit 1 is capable of emitting a red light, a green light, or a blue light. A transparent conductive layer 108 made of a conductive material, such as indium tin oxide (ITO), cadmium tin oxide (CTO), antimony tin oxide, indium zinc oxide, zinc aluminum oxide, or zinc tin oxide, is formed on the light-emitting structure 102 for current spreading. A first bonding pad 104 is formed on the passivation layer 103 and electrically connected to the first semiconductor layer 102a. A second bonding pad 105 is formed on the light-emitting structure 102 and electrically connected to the second semiconductor layer 102c. A passivation layer 103 is formed on one or more surfaces of the light-emitting structure 102 and made of one or more dielectric materials, such as SiO$_2$ or Si$_3$N$_4$. The passivation layer 103 is used to electrically separate the first bonding pad 104 and the second bonding pad 105 from each other. FIG. 1B illustrates a top view of the optoelectronic unit 1 without showing the first bonding pad 104 and the second bonding pad 105 of FIG. 1A. FIG. 1C illustrates a top view of the optoelectronic unit 1 as shown in FIG. 1A. An area sum of a top surface 104s of the first bonding pad 104 and a top surface 105s of the second bonding pad 105 is at least 30% above of the area of the bottom surface S1 of the optoelectronic unit 1.

Figure 2A:
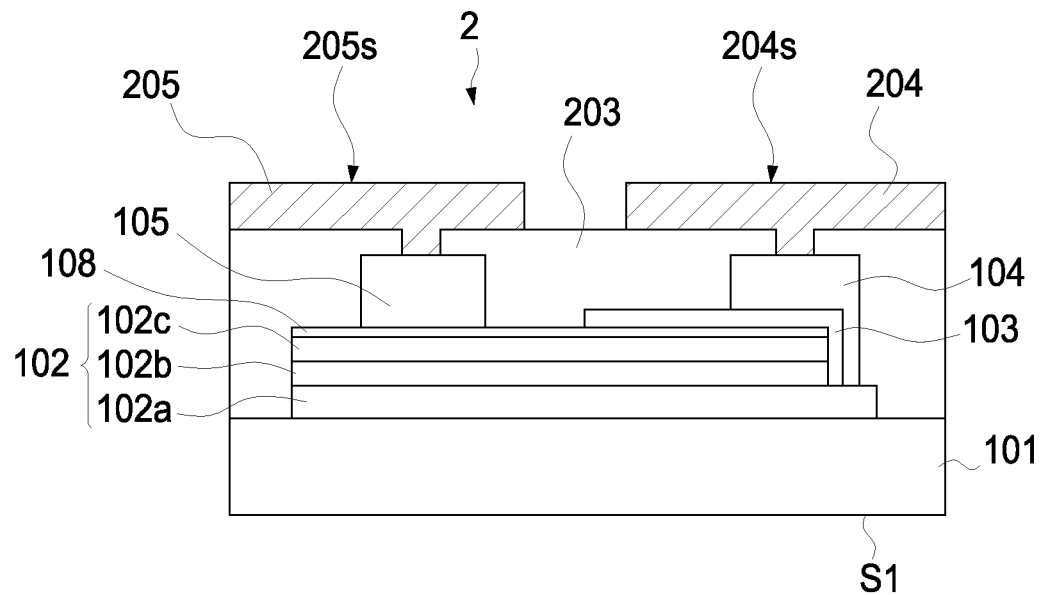
FIG. 2A illustrates a cross-sectional view of an optoelectronic unit disclosed in one embodiment of the present application.
Figure 2B:
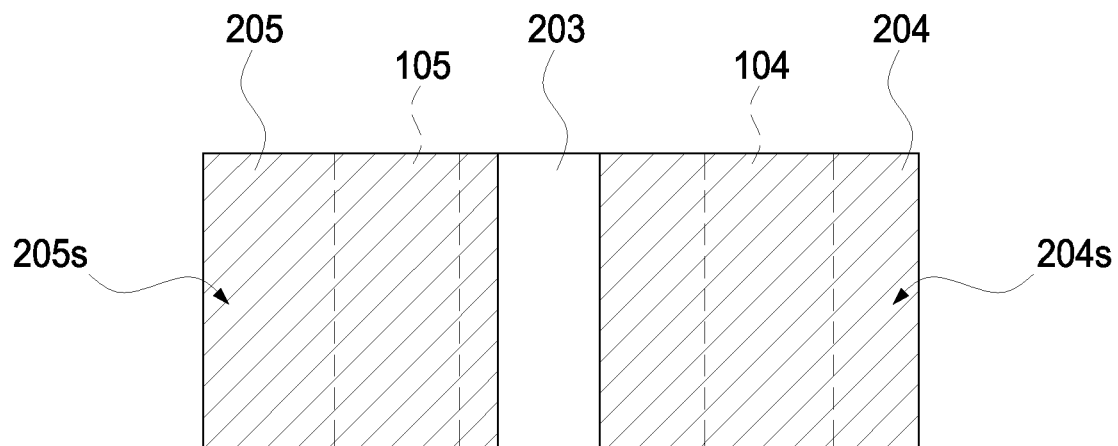
FIG. 2B illustrates a top view of the optoelectronic unit of FIG. 2A.

FIG. 2A illustrates a cross-sectional view of an optoelectronic unit 2 disclosed in one embodiment of the present application. The optoelectronic unit 2 has a bottom surface S1 with an area smaller than 50 mil$^2$, for example, the area is about 4 mil×6 mil or 2 mil×5 mil. As shown in FIG. 2A, other than the parts similar to the optoelectronic unit 1, the optoelectronic unit 2 further includes a first extension pad 204, a second extension pad 205, and a passivation layer 203. The first extension pad 204 and the second extension pad 205 can be formed on the first bonding pad 104 and the second bonding pad 105 respectively. The passivation layer 203, which can be made of one or more dielectric materials, such as SiO$_2$ or Si$_3$N$_4$, is used to electrically separate the first extension pad 204 and the second extension pad 205 from each other. FIG. 2B illustrates a top view of the optoelectronic unit 2 of FIG. 2A. A top surface 204s of the first extension pad 204 is greater than the top surface 104s of the first bonding pad 104. A top surface 205s of the second extension pad 205 is larger than the top surface 105s of the second bonding pad 105. An area sum of the top surface 204s of the first extension pad 204 and the top surface 205s of the second extension pad 205 is at least 50% above of the area of the bottom surface S1 of the optoelectronic unit 2.

Figure 3A:
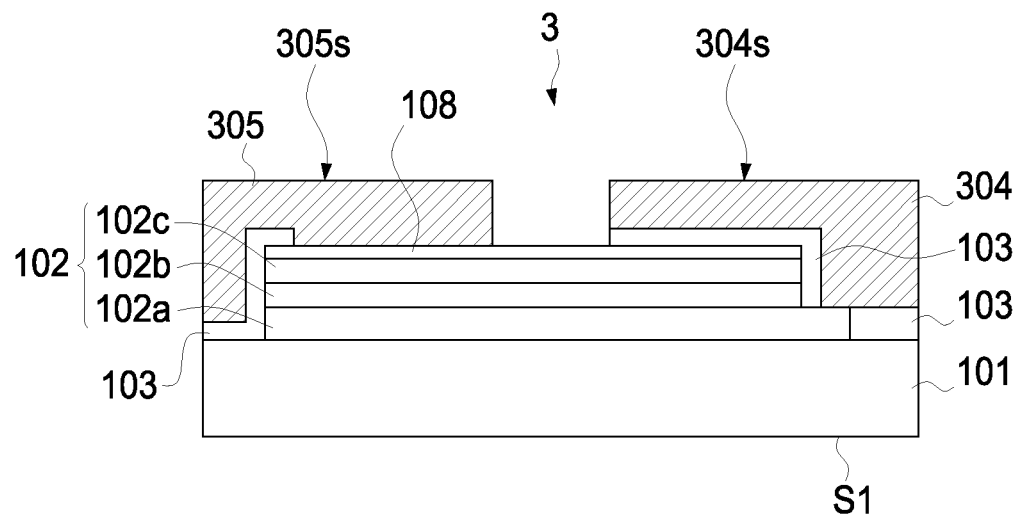
FIG. 3A illustrates a cross-sectional view of an optoelectronic unit disclosed in one embodiment of the present application.
Figure 3B:
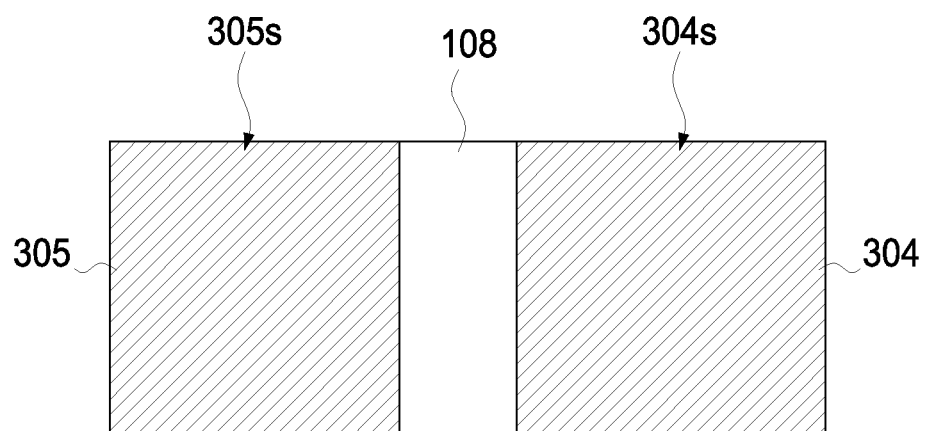
FIG. 3B illustrates a top view of the optoelectronic unit of FIG. 3A.

FIG. 3A illustrates a cross-sectional view of an optoelectronic unit 3 disclosed in one embodiment of the present application. The optoelectronic unit 3 has a bottom surface S1 with an area smaller than 50 mil$^2$, for example, the area is about 4 mil×6 mil or 2 mil×5 mil. As shown in FIG. 3A, the optoelectronic unit 3 includes a substrate 101 and a light-emitting structure 102 formed on the substrate 101. The material of the light-emitting structure 102 comprises III-V group semiconductor material. Depending on the material of the light-emitting layer 102b, the optoelectronic unit 3 is capable of emitting a red light, a green light, or a blue light. The light-emitting structure 102 includes a first semiconductor layer 102a having the first conductivity type, a second semiconductor layer 102c having the second conductivity type, and a light-emitting layer 102b formed between the first semiconductor layer 102a and the second semiconductor layer 102c. The optoelectronic unit 3 further includes a passivation layer 103 formed on one or more surfaces of the light-emitting structure 102 and made of one or more dielectric materials, such as SiO$_2$ or Si$_3$N$_4$. A transparent conductive layer 108 made of a conductive material such as indium tin oxide (ITO), cadmium tin oxide (CTO), antimony tin oxide, indium zinc oxide, zinc aluminum oxide, or zinc tin oxide, is formed on the light-emitting structure 102 for current spreading. A first electrode pad 304 and a second electrode pad 305 are formed on the same side of the substrate 101 and electrically connected to the first semiconductor layer 102a and the second semiconductor layer 102c respectively. The first electrode pad 304 and the second electrode pad 305 are electrically separated from each other by the passivation layer 103. FIG. 3B illustrates a top view of the optoelectronic unit 3 of FIG. 3A. An area sum of a top surface 304s of the first electrode pad 304 and a top surface 305s of the second electrode pad 305 is at least 50% above of the area of the bottom surface S1 of the optoelectronic unit 3.

The first bonding pad 104 and the second bonding pad 105, as shown in FIG. 1C, can function as an electrical connection path with an external power supply (not shown). The first extension pad 204 and the second extension pad 205, as shown in FIG. 2B, or the first electrode pad 304 and the second electrode pad 305, as shown in FIG. 3B, can have function(s) similar to the first bonding pad 104 and the second bonding pad 105, respectively. Taking the first bonding pad 104 as an example, if the top surface 104s of the first bonding pad 104 is large enough, it would be easier to connect or align the optoelectronic unit 1 to the external structure, for example, the external power supply. The first extension pad 204 formed on the first bonding pad 104 can further enlarge the connection area, such as the top surface 204s, so that the optoelectronic unit 2 can have even larger alignment tolerance than the optoelectronic unit 1. Accordingly, the area of the top surface 304s of the first electrode pad 304 can be approximately similar to that of the top surface 204s of the first extension pad 204, and the area of the top surface 305s of the second electrode pad 305 can also be approximately similar to that of the top surface 205s of the second extension pad 205.

Figure 4A:
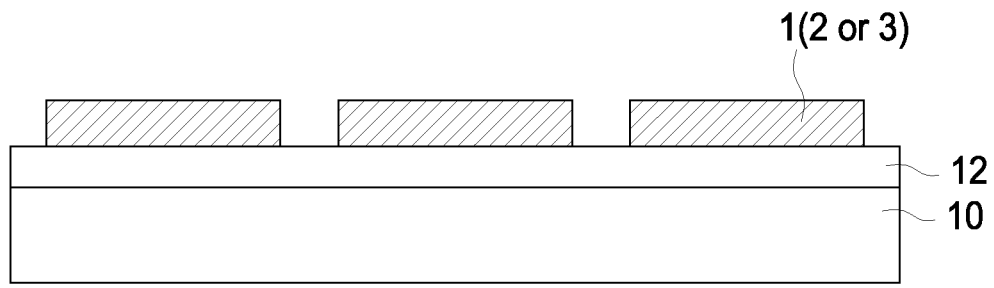
FIGS. 4A-4C illustrates a manufacturing method of an optoelectronic element disclosed in one embodiment of the present application.
Figure 4B:
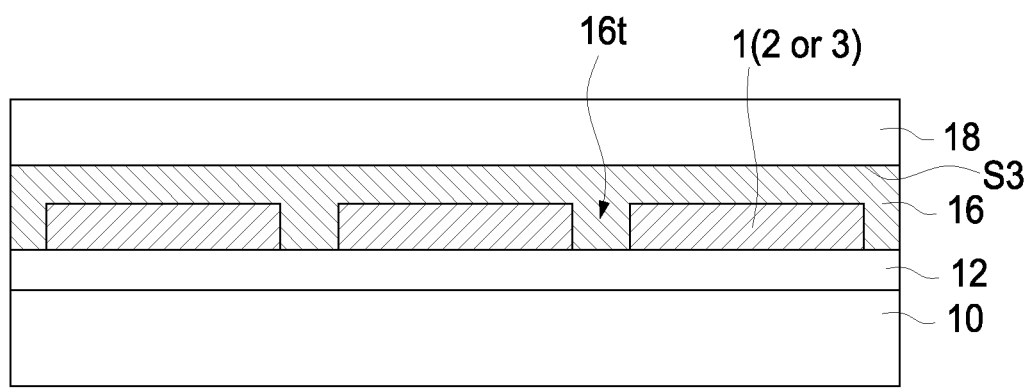
Figure 4C:
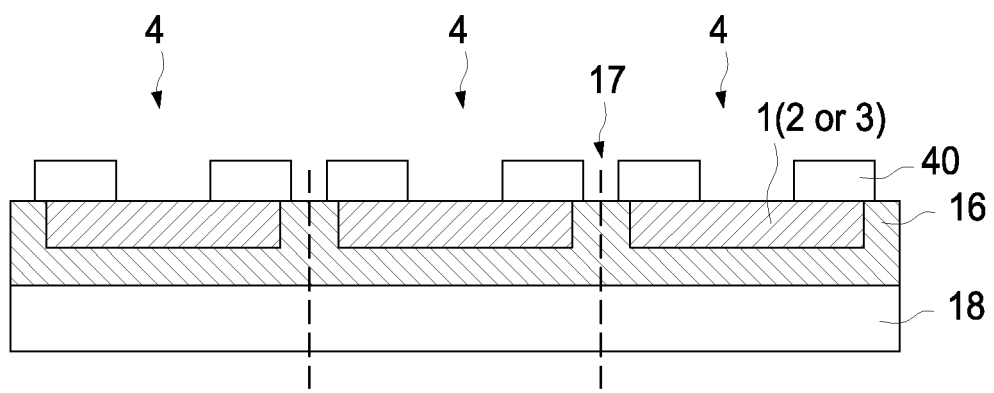

FIGS. 4A-4C illustrate a manufacturing method of an optoelectronic element 4 disclosed in one embodiment of the present application. As shown in FIG. 4A, a plurality of light-emitting units, which can be one or more kinds of the optoelectronic unit 1, 2, or 3 described above, can be provided on a temporary carrier 10. The material of the temporary carrier 10 can include one of conductive material and insulating material. The conductive material includes carbonaceous material, composite material, metal, semiconductor, or any combination thereof. The carbonaceous material is such as Diamond Like Carbon (DLC), graphite or carbon fiber. The composite material is such as Metal Matrix Composite (MMC), Ceramic Matrix Composite (CMC) or Polymer Matrix Composite (PMC). The semiconductor is such as Si, ZnSe, GaAs, SiC, GaP, GaAsP, ZnSe, InP, $LiGaO_2$, or $LiAlO_2$. The metal is such as Ni, Cu, or Al. The insulating material includes organic material, inorganic material, or any combination thereof. The organic material is such as epoxy, polyimide (PI), BCB, perfluorocyclobutane (PFCB), Su8, acrylic resin, polymethyl methacrylate (PMMA), polyethylene terephthalate (PET), polycarbonate (PC), polyetherimide, or fluorocarbon polymer. The inorganic material is such as sapphire, ZnO, diamond, glass, quartz, or AlN.

Taking the optoelectronic unit 3 as an example, a bonding layer 12 can be further provided to bond the plurality of light-emitting units 3 to the temporary carrier 10. Each of the plurality of light-emitting units 3 can include a light-emitting diode (LED) bare chip having a first electrode pad 304 and a second electrode pad 305. The bonding layer 12 can include one or more adhesive materials. The adhesive material can be an insulating material, a UV tape, or a thermal release tape. The insulating material includes but not limited to benzocyclobutene (BCB), Su8, epoxy, or spin-on-glass (SOG).

After aforementioned steps, the light-emitting units 3 can be encapsulated by a first supporting structure 16 as shown in FIG. 4B. The first supporting structure 16 can be a transparent structure, primarily constructed of one or more of organic material or inorganic material. The organic material is such as epoxy, polyimide (PI), BCB, perfluorocyclobutane (PFCB), Su8, acrylic resin, polymethyl methacrylate (PMMA), polyethylene terephthalate (PET), polycarbonate (PC), polyetherimide, or fluorocarbon polymer. The inorganic material is such as glass, $Al_2O_3$, SINR, or SOG. The organic material or inorganic material can be filled in a space 16t between two adjacent light-emitting units 3. The first supporting structure 16 covering the light-emitting units 3 can hold and support the light-emitting units 3, and enhance the mechanical strength of the light-emitting units 3. In addition, a surface S3 of the first supporting structure 16 can be a smooth surface or a rough surface. A second supporting structure 18 is further formed on the first supporting structure 16 to strengthen the support of the optoelectronic unit 3 and the first supporting structure 16. The second supporting structure 18 can be a transparent structure including one material different from that of the first supporting structure 16, or has hardness greater than that of the first supporting structure 16.

As shown in FIG. 4C, the temporary carrier 10 and the bonding layer 12 are removed to expose portions of the plurality of light-emitting units 3 and the first supporting structure 16 after the first supporting structure 16 or the second supporting structure 18 is formed. A plurality of conductive structures 40, which are located on a position (not shown) opposite to the second supporting structure 18, are then formed on the exposed portions of the plurality of light-emitting units 3 and the first supporting structure 16. The conductive structure 40 can be connected to the first electrode pad 304 and the second electrode pad 305 of the light-emitting units 3 respectively. Each conductive structure 40 has a top surface area (not shown) greater than either of the first bonding pad 104 and the second bonding pad 105 of FIG. 1C, or greater than or equal to either of the first extension pad 204 and the second extension pad 205 of FIG. 2B, or greater than or equal to either of the first electrode pad 304 and the second electrode pad 305 of FIG. 3B. Finally, the plurality of optoelectronic elements 4 is separated from each other by dicing along openings 17, as shown in FIG. 4C. At least one of the length, the width and the area of the optoelectronic element 4 is within the same order of the optoelectronic unit 1, 2, or 3.

Figure 5A:
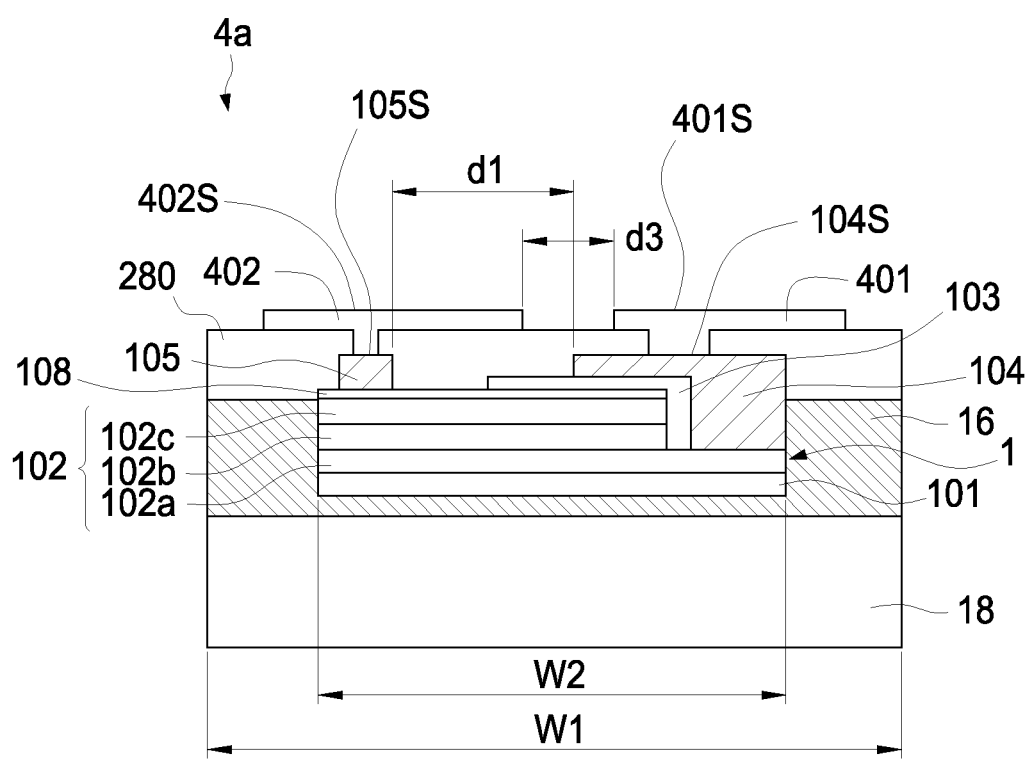
FIG. 5A illustrates a cross-sectional view of an optoelectronic element disclosed in one embodiment of the present application.

FIG. 5A illustrates a cross-sectional view of an optoelectronic element 4a. The optoelectronic element 4a includes an optoelectronic unit 1, a first supporting structure 16 formed on the optoelectronic unit 1, and a second supporting structure 18 formed on the first supporting structure 16. Preferably, the first supporting structure 16 can be formed in a shape surrounding the optoelectronic unit 1. A first conductive structure 401 and a second conductive structure 402 are formed on the optoelectronic unit 1, and respectively connected to the first bonding pad 104 and the second bonding pad 105 of the optoelectronic unit 1. A top surface area 401s of the first conductive structure 401 is larger than the top surface 104s of the first bonding pad 104, and a top surface area 402s of the second conductive structure 402 is larger than the top surface 105s of the second bonding pad 105. The passivation layer 103, which is disposed on the light-emitting structure 102, can isolate the first bonding pad 104 and the second bonding pad 105, and protect the light-emitting structure 102. A reflective layer 280 can be formed on the optoelectronic unit 1 and the first supporting structure 16. The reflective layer 280 can be made of one or more reflective materials, such as dielectrically material, for example, $SiO_2$, $Si_3N_4$, or metal oxide, such as titanium dioxide or other white substance. In an example of the present application, the reflective layer 280 can be a single layer or a stack. A ratio of a volume of the optoelectronic element 4a and a volume of the optoelectronic unit 1 is between 1.2:1 and 10:1, preferably between 2:1 and 5:1. The second supporting structure 18 has a first width W1. The optoelectronic unit 1 has a second width W2. The first width W1 is larger than the second width W2, for example, the first width W1 is at least 1.5 times the second width W2. The first distance d1 between the first bonding pad 104 and the second bonding pad 105 is larger than the third distance d3 between the first conductive structure 401 and the second conductive structure 402.

Figure 5B:
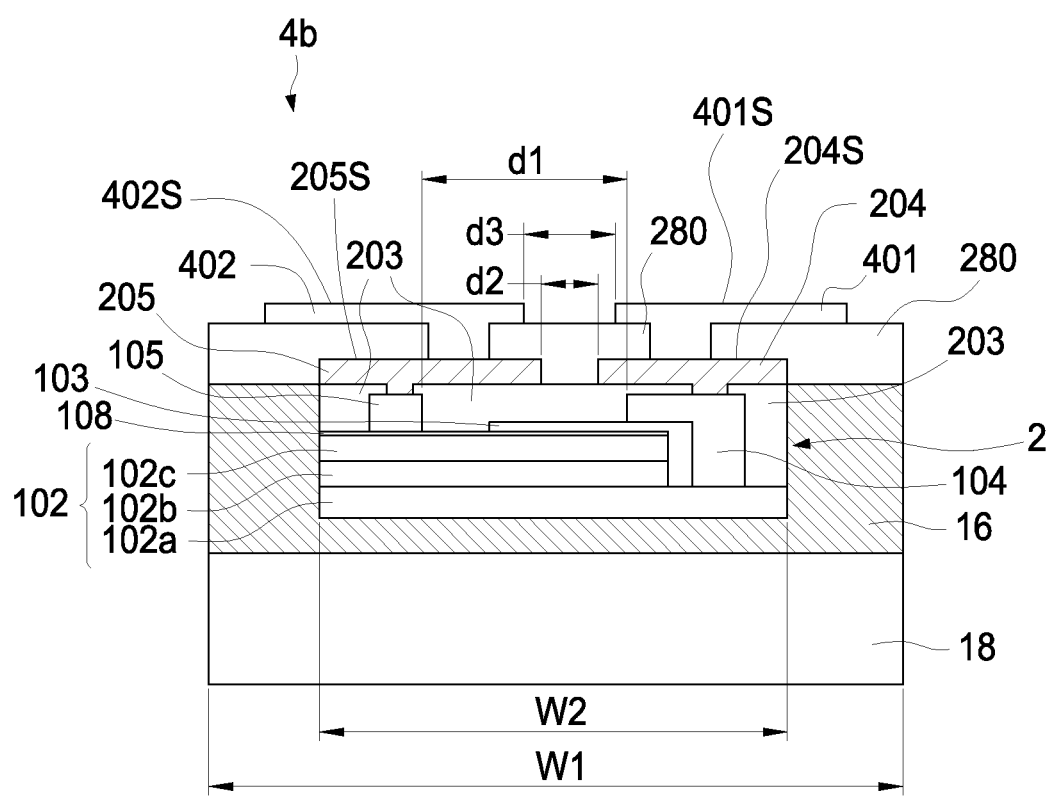
FIG. 5B illustrates a cross-sectional view of an optoelectronic element disclosed in one embodiment of the present application.

FIG. 5B illustrates a cross-sectional view of an optoelectronic element 4b. The optoelectronic element 4b includes an optoelectronic unit 2, a first supporting structure 16 formed on the optoelectronic unit 2, and a second supporting structure 18 formed on the first supporting structure 16. The first supporting structure 16 can be formed in a shape surrounding the optoelectronic unit 2. A first conductive structure 401 and a second conductive structure 402 are formed on the optoelectronic unit 2, and connected to the first extension pad 204 and the second extension pad 205, respectively. A reflective layer 280 can be formed on the optoelectronic unit 2 and the first supporting structure 16. The reflective layer 280 can be made of one or more reflective materials, such as dielectrically material, for example, $SiO_2$, $Si_3N_4$, or metal oxide, such as titanium dioxide or other white substance. In an example of the present application, the reflective layer 280 can be a single layer or a stack. The first conductive structure 401 has a top surface area 401s larger than or equal to a top surface area 204s of the first extension pad 204, and the second conductive structure 402 has a top surface area 402s larger than or equal to a top surface area 205s of the second extension pad 205. A ratio of a volume of the optoelectronic element 4b and a volume of the optoelectronic unit 2 is between 1.2:1 and 10:1, preferably between 2:1 and 5:1. The second supporting structure 18 has a first width W1, and the optoelectronic unit 2 has a second width W2. The first width W1 is larger than the second width W2, for example, the first width W1 is at least 1.5 times the second width W2. A first distance d1 between the first bonding pad 104 and the second bonding pad 105 is larger than a second distance d2 between the first extension pad 204 and the second extension pad 205, and further larger than a third distance d3 between the first conductive structure 401 and the second conductive structure 402. However, FIG. 5B is only illustrative but not limitative. In an example of the present application, the second distance d2 can be equal to, larger, or smaller than the third distance d3.

Figure 5C:
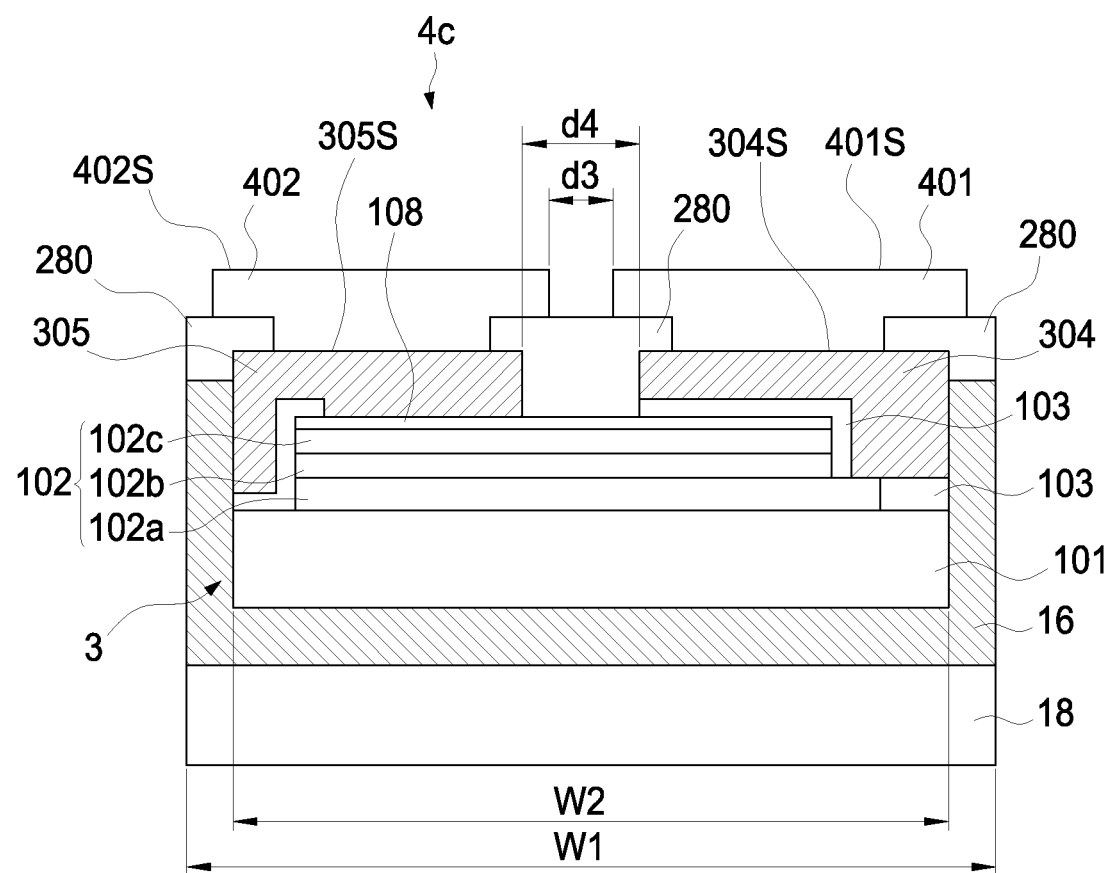
FIG. 5C illustrates a cross-sectional view of an optoelectronic element disclosed in one embodiment of the present application.

FIG. 5C illustrates a cross-sectional view of an optoelectronic element 4c. The optoelectronic element 4c includes an optoelectronic unit 3, a first supporting structure 16 formed on the optoelectronic unit 3, and a second supporting structure 18 formed on the first supporting structure 16. The optoelectronic unit 3 can be surrounded by the first supporting structure 16. A first conductive structure 401 and a second conductive structure 402 are formed on the optoelectronic unit 3, and connected to the first electrode pad 304 and the second electrode pad 305, respectively. A reflective layer 280 can be formed on the optoelectronic unit 3 and the first supporting structure 16. The reflective layer 280 can be made of one or more reflective materials, such as dielectrically material, for example, $SiO_2$, $Si_3N_4$, or metal oxide, such as titanium dioxide or other white substance. The first conductive structure 401 has a top surface area 401s larger than or equal to a top surface area 304s of the first electrode pad 304, and the second conductive structure 402 has a top surface area 402s larger than or equal to a top surface area 305s of the second electrode pad 305. A ratio of a volume of the optoelectronic element 4c and a volume of the optoelectronic unit 3 is between 1.2:1 and 10:1, preferably between 2:1 and 5:1. The second supporting structure 18 has a first width W1 and the optoelectronic unit 3 has a second width W2. The first width W1 is larger than the second width W2, for example, the first width W1 is at least 1.5 times the second width W2. A distance d4 between the first electrode pad 304 and the second electrode pad 305 is larger than or equal to a third distance d3 between the first conductive structure 401 and the second conductive structure 402. However, FIG. 5C is only illustrative but not limitative.

Figure 6A:
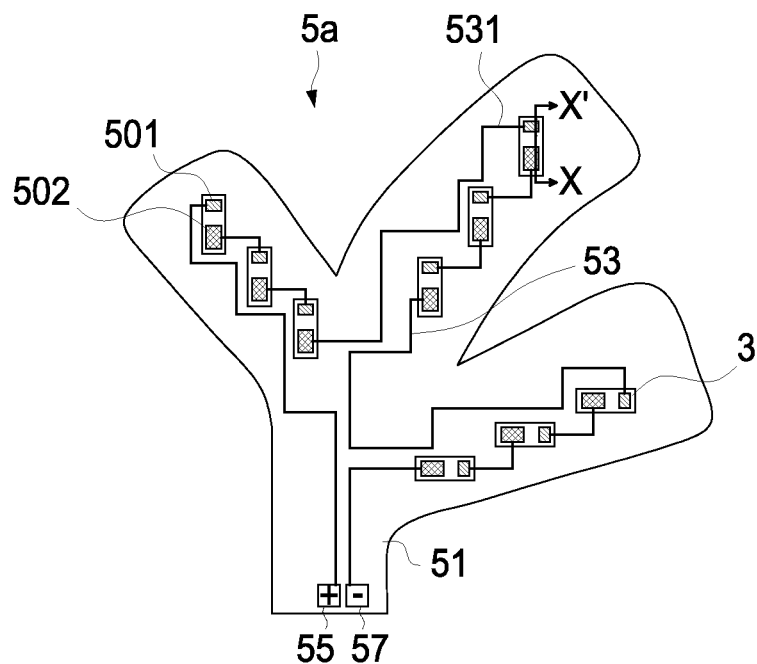
FIG. 6A is a diagram illustrating a light-emitting device including a plurality of optoelectronic elements in accordance with an embodiment of the present application.

FIG. 6A illustrates a light-emitting device 5a in accordance with an embodiment of the present application. The light-emitting device 5a comprises a supporting structure 51. In one embodiment, the supporting structure 51 can be an opaque structure or a transparent structure having an average light transmittance above 60%, preferably above 70% between visible light regions. The material of the transparent structure comprises organic material, inorganic material, or both thereof. The organic material comprises plastics. The inorganic material comprises glass, quartz, $Al_2O_3$, diamond, or the combination thereof. In another embodiment, the supporting structure 51 can be a flexible structure comprising flexible material, such as flexible glass or flexible plastics, and the flexible structure can be bent into any shape to achieve a desired emission pattern. In another embodiment, the supporting structure 51 is thermally stable and has a heat resistance. A melting point of the supporting structure 51 is higher than an operation temperature of the light-emitting device 5a. The heat generated during the operation of the light-emitting device 5a does not deform or melt down the supporting structure 51.

One or more kinds of the optoelectronic unit 1, 2, or 3, or the optoelectronic elements 4a, 4b, or 4c described above can be applied to the light-emitting device 5a and formed on the supporting structure 51 with conductive material or non-conductive material. The conductive material comprises metal or metal oxides such as indium tin oxide (ITO), cadmium tin oxide (CTO), antimony tin oxide, indium zinc oxide, zinc aluminum oxide, or zinc tin oxide. The non-conductive material comprises epoxy, polyimide (PI), BCB, perfluorocyclobutane (PFCB), Sub, polyethylene terephthalate (PET), polycarbonate (PC), polyetherimide, or fluorocarbon polymer. In another embodiment, the optoelectronic unit 1, 2, or 3, or the optoelectronic elements 4a, 4b, or 4c can also be formed on the supporting structure 51 with an anisotropic conductive film (ACF).

If the supporting structure 51 is transparent, one or more kinds of the optoelectronic unit 1, 2, or 3, or the optoelectronic element 4a, 4b, or 4c described above can be embedded into the supporting structure with the manufacturing method described in FIGS. 4A-4C. In another embodiment, a plurality of bonding pads such as solder bumps can be formed on a top surface of the supporting structure at pre-determined positions, and one or more kinds of the optoelectronic unit 1, 2, or 3, or the optoelectronic element 4a, 4b, or 4c described above can be flipped and bonded to the plurality of bonding pads.

If the supporting structure 51 is opaque, a plurality of bonding pads such as solder bumps can be formed on a top surface of the supporting structure at pre-determined positions, and one or more kinds of the optoelectronic unit 1, 2, or 3, or the optoelectronic element 4a, 4b, or 4c described above can be flipped and bonded to the plurality of bonding pads.

FIG. 6A illustrates an example of the light-emitting units 3 being embedded in the supporting structure 51. In the embodiment, the light-emitting device 5a includes a plurality of light-emitting units 3 embedded in the supporting structure 51, wherein the supporting structure 51 is a transparent structure with one or more cavities (not shown) accommodating the plurality of optoelectronic unit 3. As shown in FIG. 6A, the plurality of light-emitting units 3 is electrically coupled together in a series connection by a conductive element 53, wherein the material of the conductive element 53 can be metal. The conductive element 53 has a portion 531 arranged on the supporting structure 51 between two of the cavities. The conductive element 53 can be made by metal wiring, chemical deposition, or electrical plating.

If one or more kinds of the light-emitting units 1, 2, or 3 described above are applied to the light-emitting device 5a, a first conductive structure and a second conductive structure can be optionally formed on the light-emitting units 1, 2, or 3 to enlarge alignment tolerance between the conductive element 53 and the light-emitting units 1, 2, or 3. In the embodiment shown in FIG. 6A, one optoelectronic unit 3 is embedded in one cavity, a first conductive structure 501 and a second conductive structure 502 are respectively formed on the first electrode pad 304 and the second electrode pad 305, shown in FIG. 3A, of the optoelectronic unit 3, and the conductive element 53 forms a circuit electrically connecting the first conductive structure 501 of one optoelectronic unit 3 with the second conductive structure 502 of another optoelectronic unit 3.

If one or more kinds of the optoelectronic element 4a, 4b, or 4c described above are applied to the light-emitting device 5a, the conductive element 53 can form a circuit electrically connecting the first conductive structure 401, shown in FIGS. 5A-5C, of one optoelectronic element 4a, 4b, or 4c with the second conductive structure 402, shown in FIGS. 5A-5C, of another optoelectronic element 4a, 4b, or 4c.

After that, the conductive element 53 can be used to form a circuit electrically connecting the optoelectronic unit 1, 2, or 3, or the optoelectronic element 4a, 4b, or 4c. The circuit has a first terminal 55 and a second terminal 57 arranged on one end of the supporting structure 51 to be electrical contact points, which are denoted by symbols of '+' and '−', and can be electrically connected to a power supply (not shown).

Figure 6B:
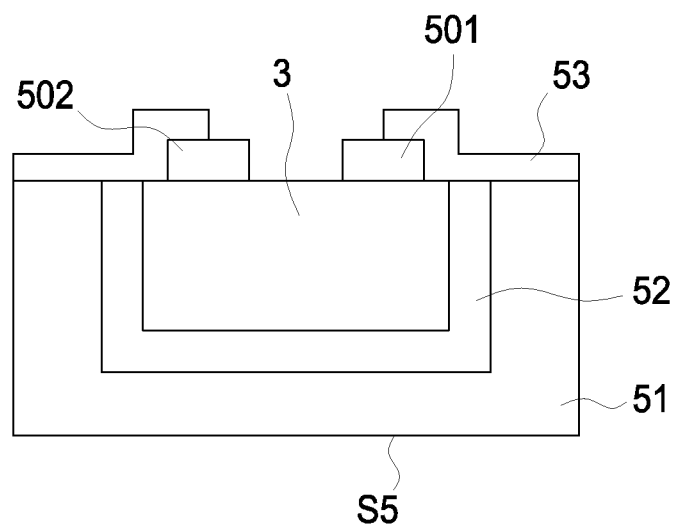
FIG. 6B illustrates a cross-sectional view of the light-emitting device along X-X' line of FIG. 6A.

FIG. 6B illustrates a cross-sectional view of the light-emitting device 5a having the optoelectronic unit 3 along X-X' line shown in FIG. 6A. A transparent structure, such as a bonding layer 52, including one wavelength converting material, such as yellow phosphor or dye, can be formed between the supporting structure 51 and the optoelectronic unit 3. As shown in FIG. 6B, the conductive elements 53 are formed on the first conductive structure 501 and the second conductive structure 502 to electrically connected with the optoelectronic unit 3 with the method described above.

Figure 6C:
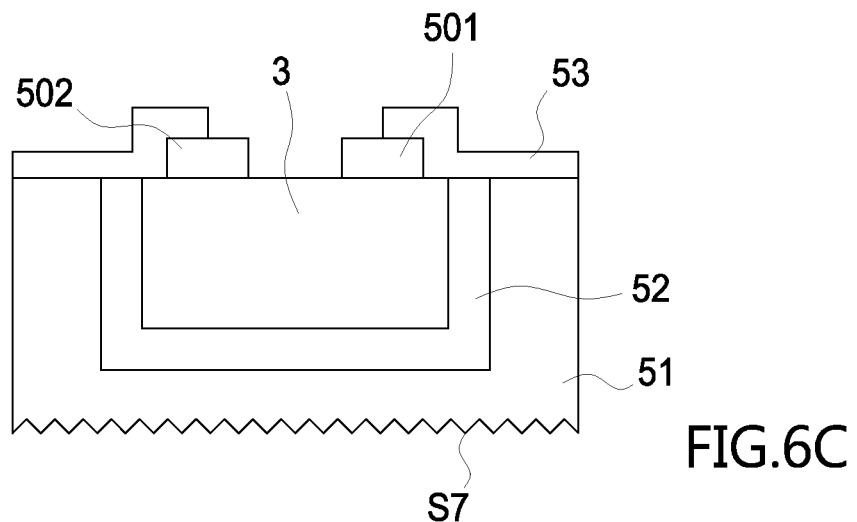
FIG. 6C illustrates a cross-sectional view of the light-emitting device along X-X' line of FIG. 6A.
Figure 6D:
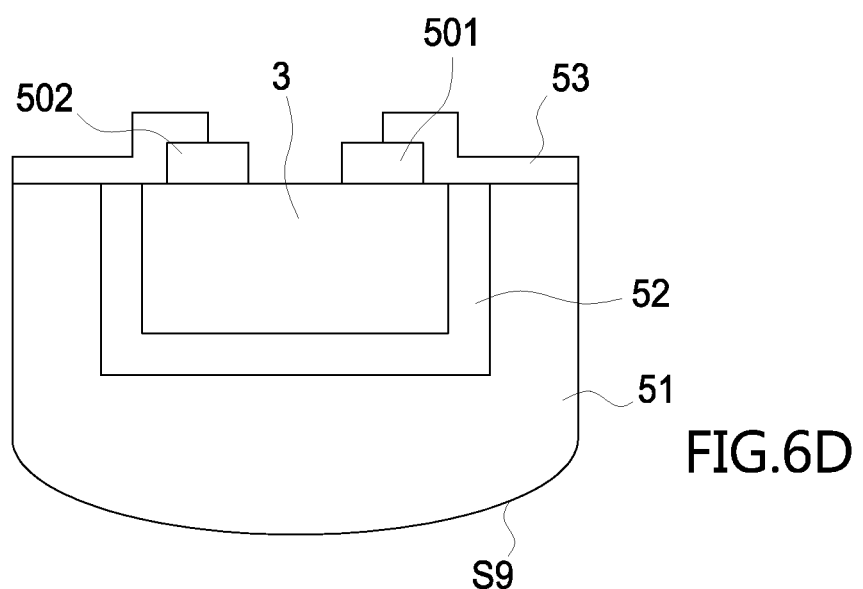
FIG. 6D illustrates a cross-sectional view of the light-emitting device along X-X' line of FIG. 6A.

In accordance with several embodiments of the present application, the supporting structure 51 can have one flat surface, such as the surface S5 shown in FIG. 6B, or at least one rough surface having a protrusion, such as the surface S7 shown in FIG. 6C, or a curved surface S9 shown in FIG. 6D. As shown in FIG. 6C, the surface S7 can have a zigzag configuration. As shown in FIG. 6D, the curved surface S9 can have a hemispherical contour.

Figure 6E:
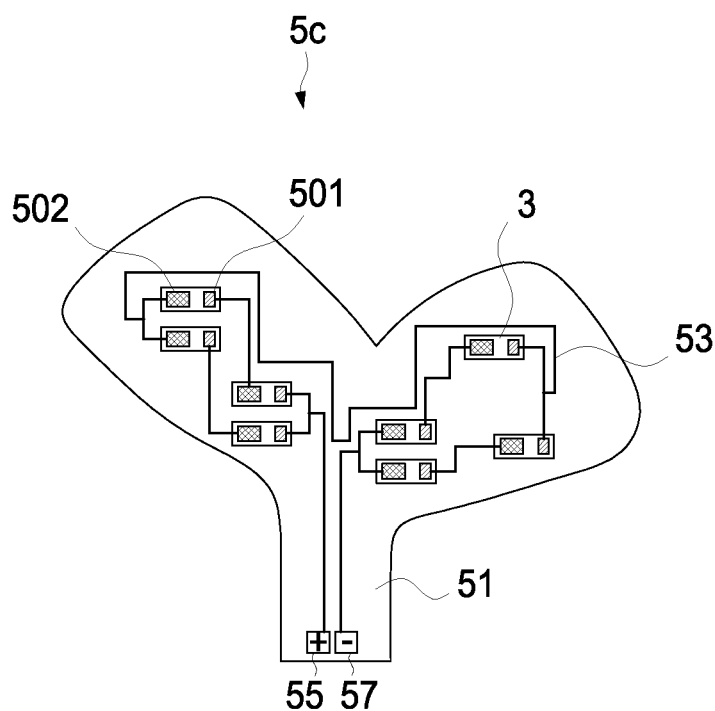
FIG. 6E is a diagram illustrating a light-emitting device including a plurality of optoelectronic elements in accordance with an embodiment of the present application.

FIG. 6E illustrates a light-emitting device 5c in accordance with a further embodiment of the present application. One or more kinds of the optoelectronic unit 1, 2, 3, the optoelectronic elements 4a, 4b, or 4c described above can be applied to the light-emitting device 5c. Taking the optoelectronic unit 3 as an example, the light-emitting device 5c includes a plurality of light-emitting units 3 which can be electrically coupled together in series, parallel, or a combination thereof by the conductive element 53. For example, several light-emitting units 3 are firstly connected to form a series array, and two or more series arrays are electrically connected to form a parallel array. Moreover, two or more parallel arrays are coupled with each other in series, as shown in FIG. 6E. In details, the conductive element 53 is electrically connected to the first conductive structure 501 and the second conductive structure 502 of each optoelectronic unit 3. Therefore, the light-emitting units 3 are connected with each other by the conductive element 53. In addition, heat generated by the optoelectronic elements can be dissipated via the conductive element 53.

Taking the plurality of optoelectronic unit 3 as an example in one embodiment, which is not intended to limit the scope of the present application, and other examples, such as the plurality of optoelectronic unit 1, 2, the plurality of optoelectronic elements 4a, 4b or 4c, can be applied in the same method. In the embodiment, the plurality of optoelectronic unit 3 is separated from each other at an appropriate spacing, and optionally arranged in a cluster configuration. The spacing between the light-emitting units 3 can be fixed, non-fixed, or variable. The spacing between the light-emitting units 3 near the circumstance of the supporting structure 51 is larger than that of the light-emitting units 3 near the center of the supporting structure 51 from the diagram of the light-emitting device 5a shown in FIG. 6A or the light-emitting device 5c shown in FIG. 6E. The more the light-emitting units 3 are used, and the brighter the light-emitting device 5a or 5c is. As shown in FIG. 6A or FIG. 6E, the plurality of light-emitting units 3 is arranged in a shape of a perspective view, including but not limited to, a blade type, a linear type, a dispersive type, or a combination thereof. In one embodiment, the supporting structure 51 comprises a root having the first terminal 55 and the second terminal 57, a stem connected to the root and extended along a first direction, and a plurality of branches connected to the stem and extended along one or more directions different from the first direction.

Figure 7:
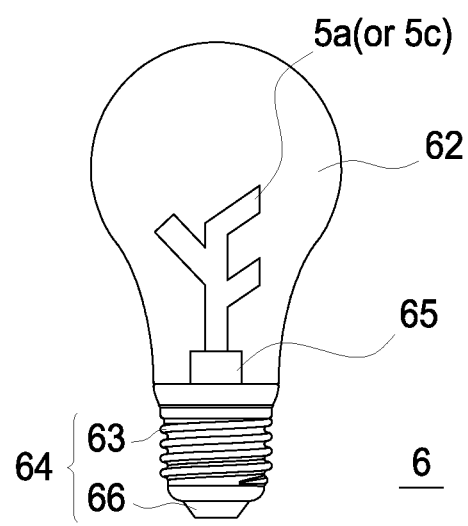
FIG. 7 illustrates a front view of a light bulb in accordance with an embodiment of the present application.

The light-emitting device 5a or 5c of the present application can be constructed and arranged for different uses, for example, light bulb, emergency light, PAR light, automotive light, street lighting, subway lighting or indoor lighting. FIG. 7 illustrates a front view of a light bulb 6 in accordance with an embodiment of the present application. One or more kinds of the light-emitting device 5a and 5c described above can be applied to the light bulb 6. Taking the light-emitting device 5a as an example, the light bulb 6 includes one light-emitting device 5a, a socket 65 electrically connected to the light-emitting device 5a, a contact member 64, and a cover 62. The light-emitting devices 5a can be a tube having a dispersive configuration or a linear arrangement. The dispersive configuration is such as blade-like shape, flower-like shape, branch-like shape, vein-like shape, cylinder shape, U-shape, or arc shape. The linear arrangement is such as a rectangular shape. The light-emitting device 5a can be plugged into the socket 65. In the socket 65, there are circuits for electrically connecting the light-emitting device with an electrical power (not shown). The cover 62 can be formed in a shape such as globe, tube, or candle. The cover 62 also can be formed in a shape referred to American National Standard Institute (ANSI) standards, such as A series, B series, S series, F series, and G series. The material of the cover 62 comprises glass or plastic. An air, a transparent material, or both thereof can be filled in the cover 62. The contact member 64 has a screw thread 63 and a base pin 66 which are functioned as two terminals for connecting with an AC power (not shown). Moreover, the screw thread 63 can be also used to fasten the light bulb 6 into a socket (not shown). The contact member 64 can be configured to fit within and electrically contact with a standard electrical socket such as E40 socket, E27 socket, E26 socket, and E14 socket. The contact member 64 can accommodate a driver (not shown) having circuits for rectification, and overload protection.

Figure 8A:
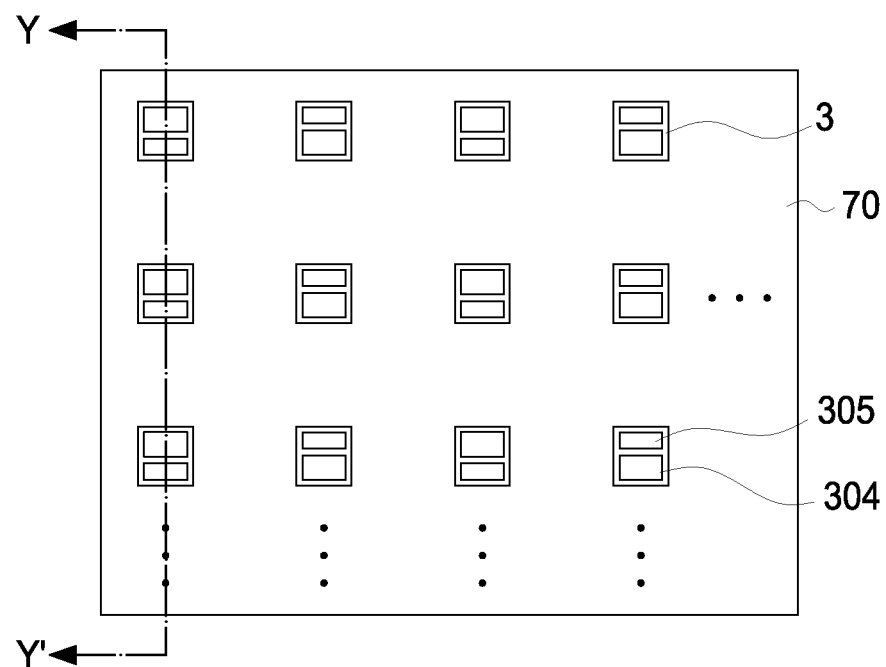
FIGS. 8A-8B, 9A-9B, 10A-10B, 11A, 11B, 11C and 11D, 12A-12B, 13A-13B, 14A-14B, 15, 16, and 17 illustrate a manufacturing method of a light-emitting device in accordance with an embodiment of the present application.
Figure 8B:
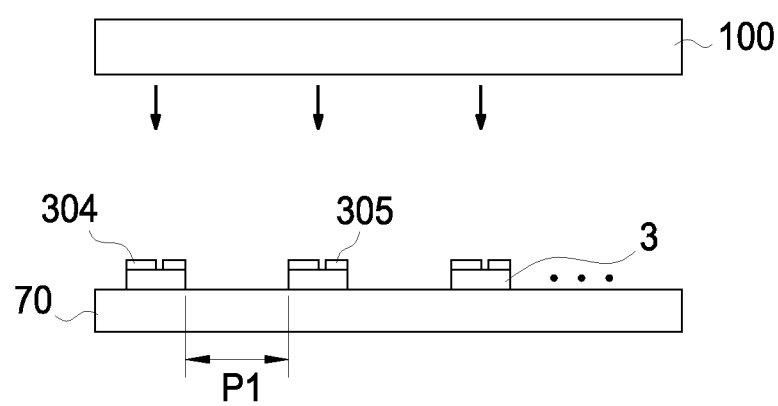
Figure 14A:
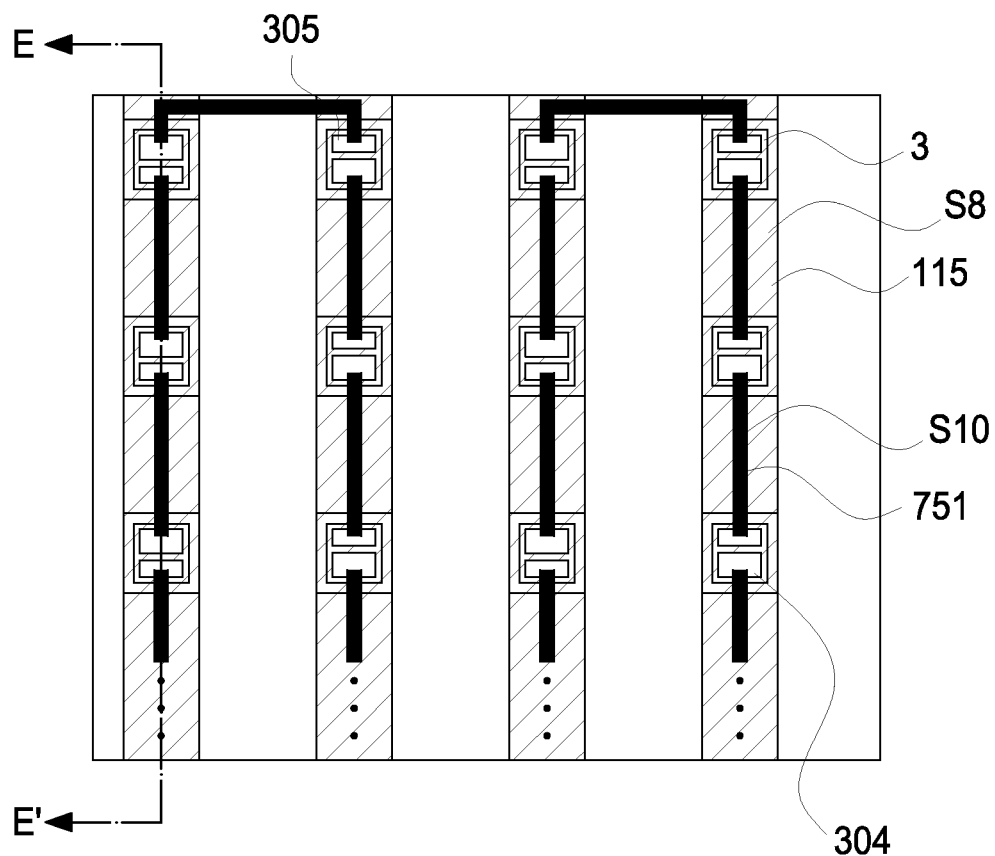
Figure 14B:
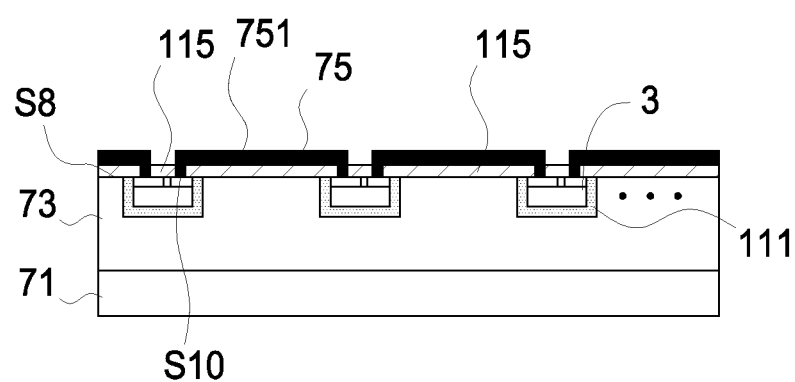
Figure 15:
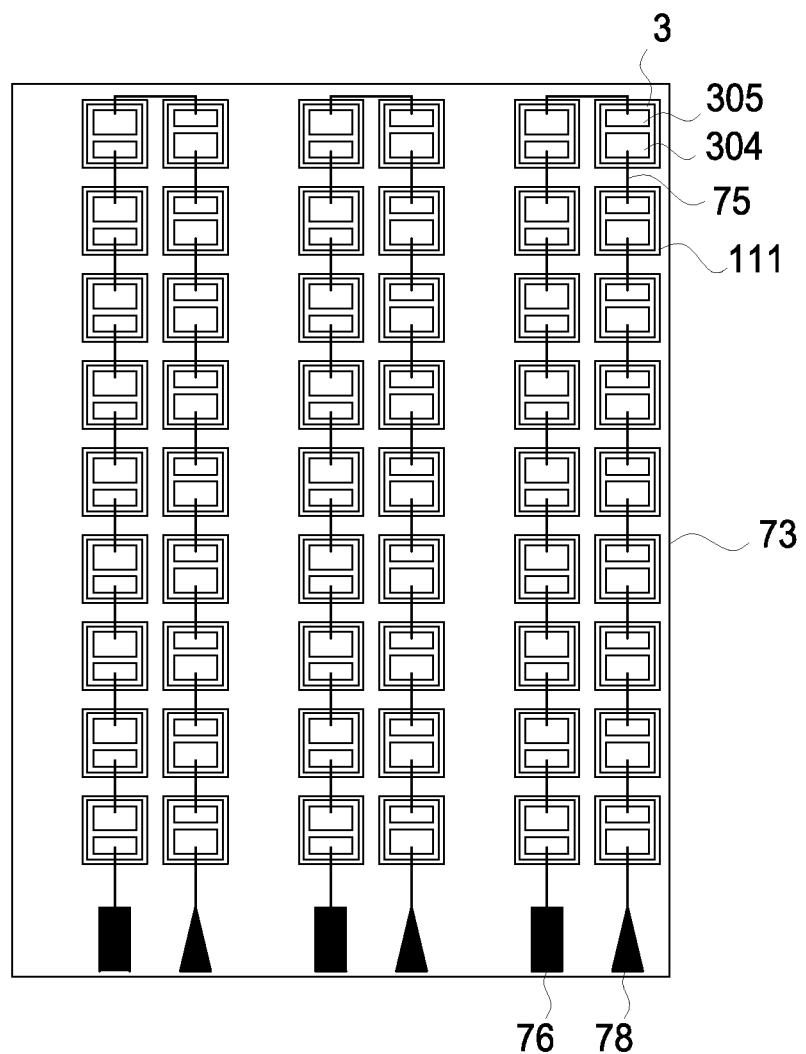
Figure 16:
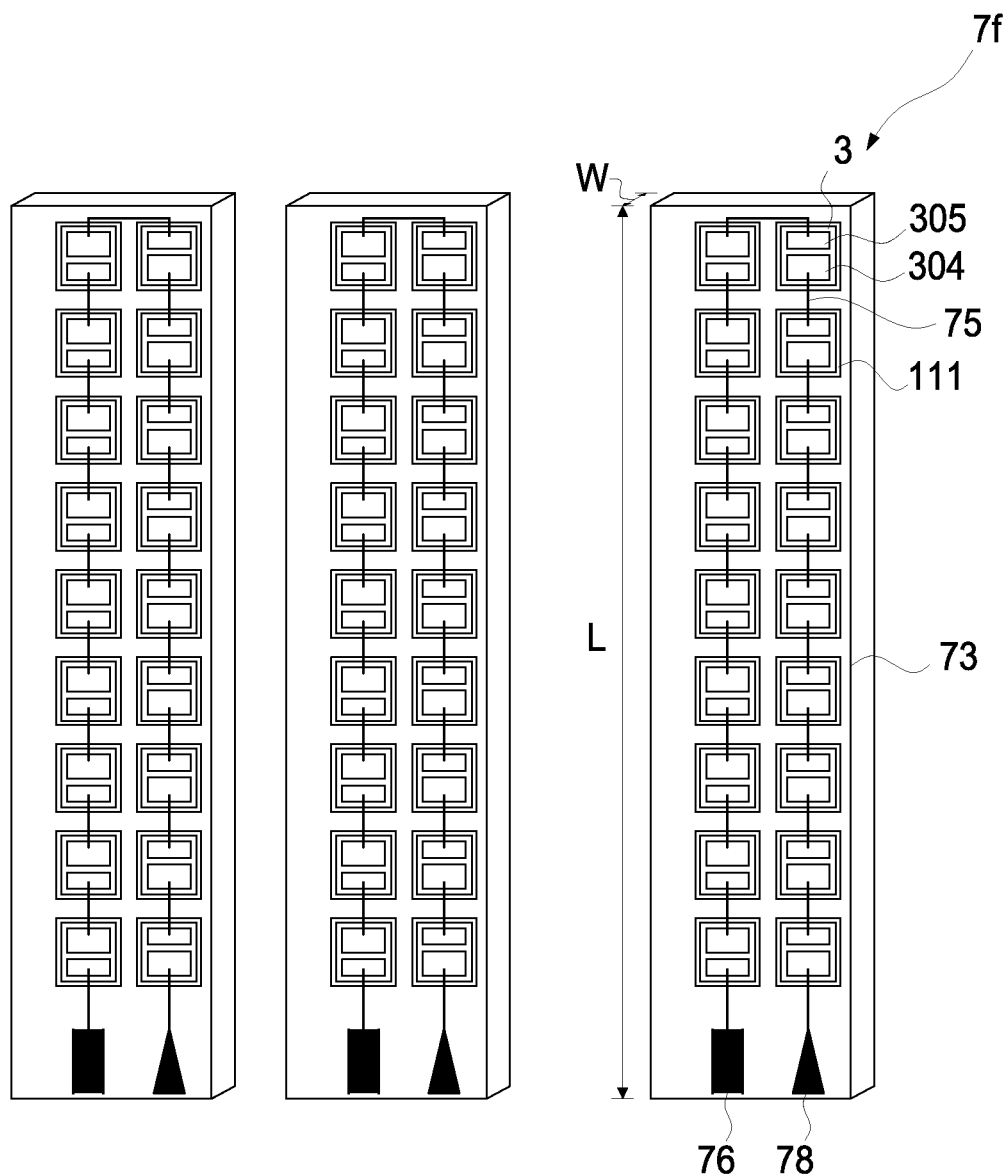
Figure 17:
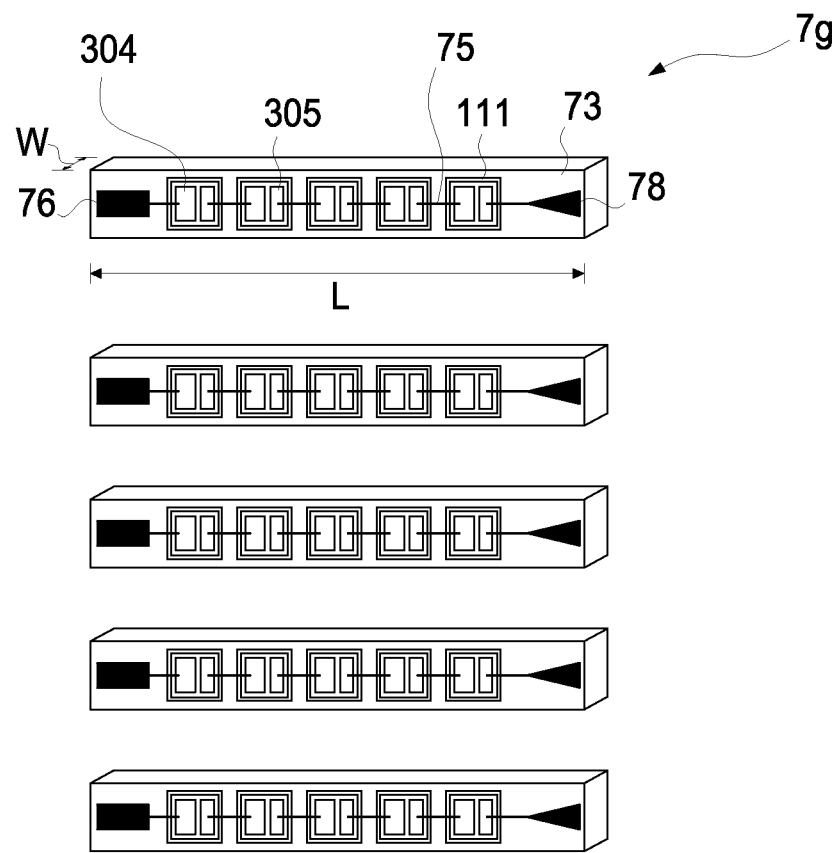

FIGS. 8A-15 illustrate steps of manufacturing a light-emitting device 7f shown in FIG. 16 or a light-emitting device 7g shown in FIG. 17 in accordance with embodiments of the present application. In FIGS. 8A-15, the optoelectronic unit 3 is referred in the following description, but one or more kinds of the light-emitting units 1, 2, or 3, or the optoelectronic elements 4a, 4b, or 4c described above can be applied to the steps. FIG. 8A illustrates a top view of a plurality of light-emitting units 3 formed on a temporary substrate 70. FIG. 8B illustrates a cross-sectional view along line Y-Y' in FIG. 8A. As shown in FIGS. 8A and 8B, several light-emitting units 3 with a first electrode pad 304 and a second electrode pad 305 formed thereon can be formed on the temporary substrate 70 with a first pitch P1. In another embodiment, the light-emitting units 3 can be grown on a growth substrate with a first pitch P1. The light-emitting units 3 are transferred to a temporary carrier 100. In details, the light-emitting units 3 can be transferred from the temporary substrate 70 to predetermined positions of the temporary carrier 100 by manual pick-up or mechanical pick-up. Specifically, the light-emitting units 3 can also be transferred to the temporary carrier 100 by an adhesive material. Moreover, the light-emitting units 3 can be transferred one by one, or in a batch.

Figure 9A:
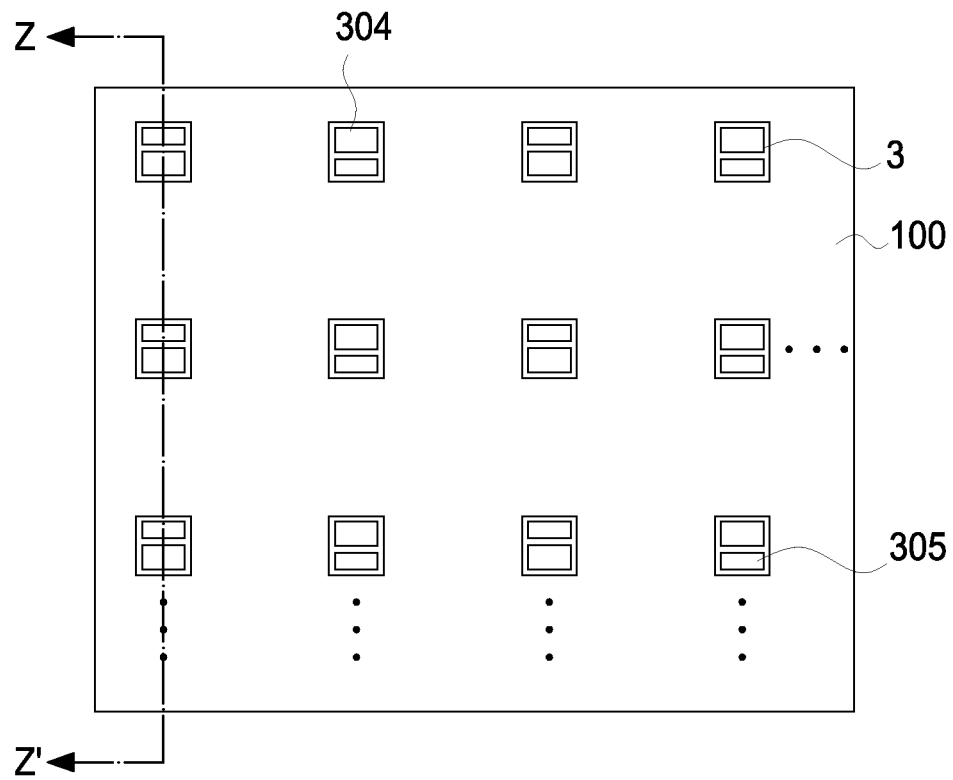
Figure 9B:
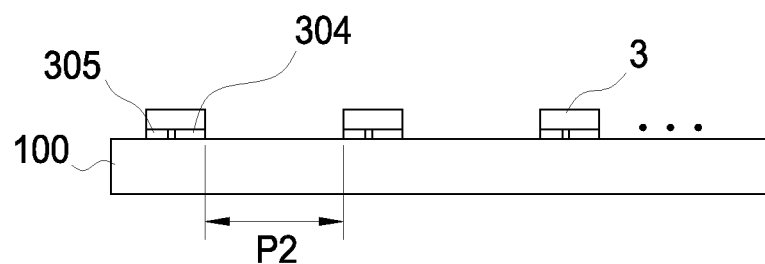

FIG. 9A illustrates a top view of a plurality of light-emitting units 3 formed on a temporary carrier 100 in accordance with an embodiment of the present application. FIG. 9B illustrates a cross-sectional view along line Z-Z' shown in FIG. 9A. FIG. 9B illustrates that the light-emitting units 3 are transferred to the temporary carrier 100 from a temporary substrate 70 or the growth substrate in accordance with another embodiment of the present application. The temporary carrier 100 includes a material similar to that mentioned in the paragraph of the temporary carrier 10. In an embodiment, the temporary carrier 100 can be a tape including one or more adhesive materials to connect the light-emitting units 3. The light-emitting units 3 with a first electrode pad 304 and a second electrode pad 305 formed thereon are formed on the temporary carrier 100 with the second pitch P2 which is larger than the first pitch P1.

Figure 10A:
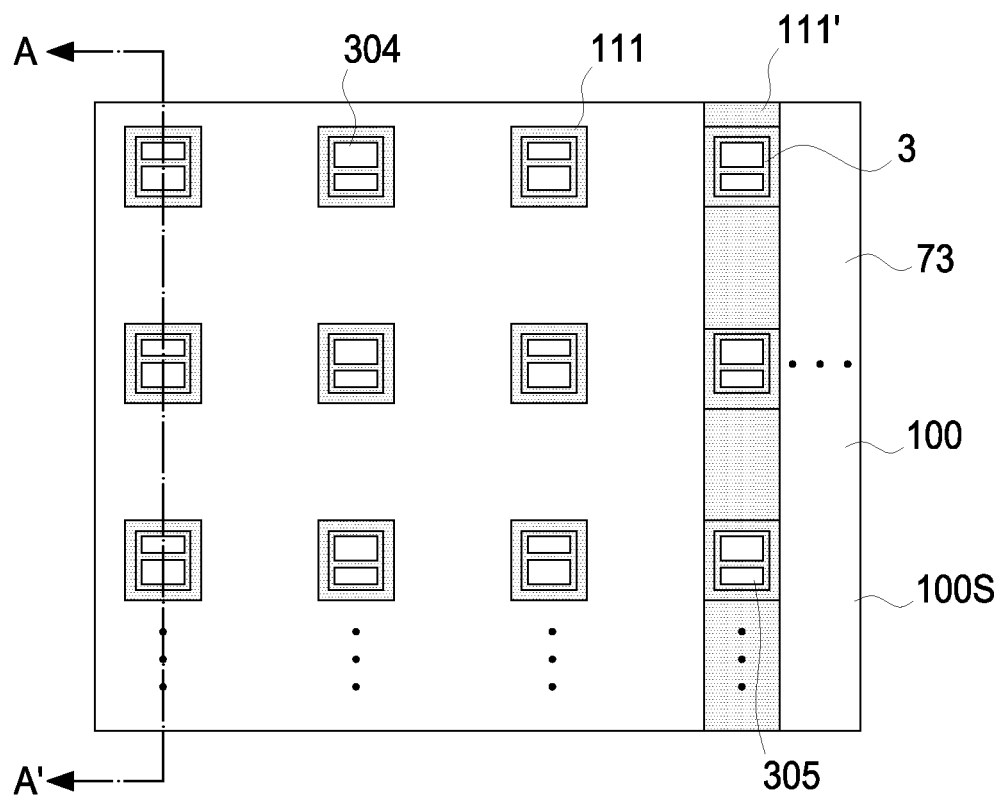
Figure 10B:
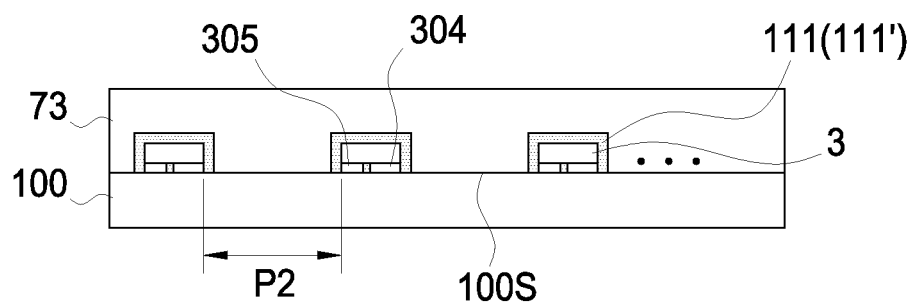

FIG. 10A illustrates a top view of light-emitting units 3 having a first electrode pad 304 and a second electrode pad 305 formed on a first supporting structure 73 in accordance with an embodiment of the present application. FIG. 10B illustrates a cross-sectional view along line A-A' shown in FIG. 10A. The first supporting structure 73 can be made having cavities configured to accommodate at least one of the light-emitting units 3. The first supporting structure 73 covering the light-emitting units 3 can hold and support the light-emitting units 3 and enhance the mechanical strength of the light-emitting units 3. The first supporting structure 73 can be a transparent structure made of one or more transparent materials. The transparent material can be made of one or more of organic material or inorganic material. The organic material is such as epoxy, polyimide (PI), BCB, perfluorocyclobutane (PFCB), Su8, acrylic resin, polymethyl methacrylate (PMMA), polyethylene terephthalate (PET), polycarbonate (PC), polyetherimide, or fluorocarbon polymer. The inorganic material is such as glass, $Al_2O_3$, SINR, or SOG. As shown in FIG. 10A, a wavelength converting layer 111 can be formed around each optoelectronic unit 3. In one embodiment, a wavelength converting layer 111' can be formed in a stripe shape, and the wavelength converting layer 111' is formed around each optoelectronic unit 3 and on part of a surface 100s of the temporary carrier 100. In another embodiment, the wavelength converting layer can be formed around each optoelectronic unit 3 and on the whole surface 100s of the temporary carrier 100.

Figure 11A:
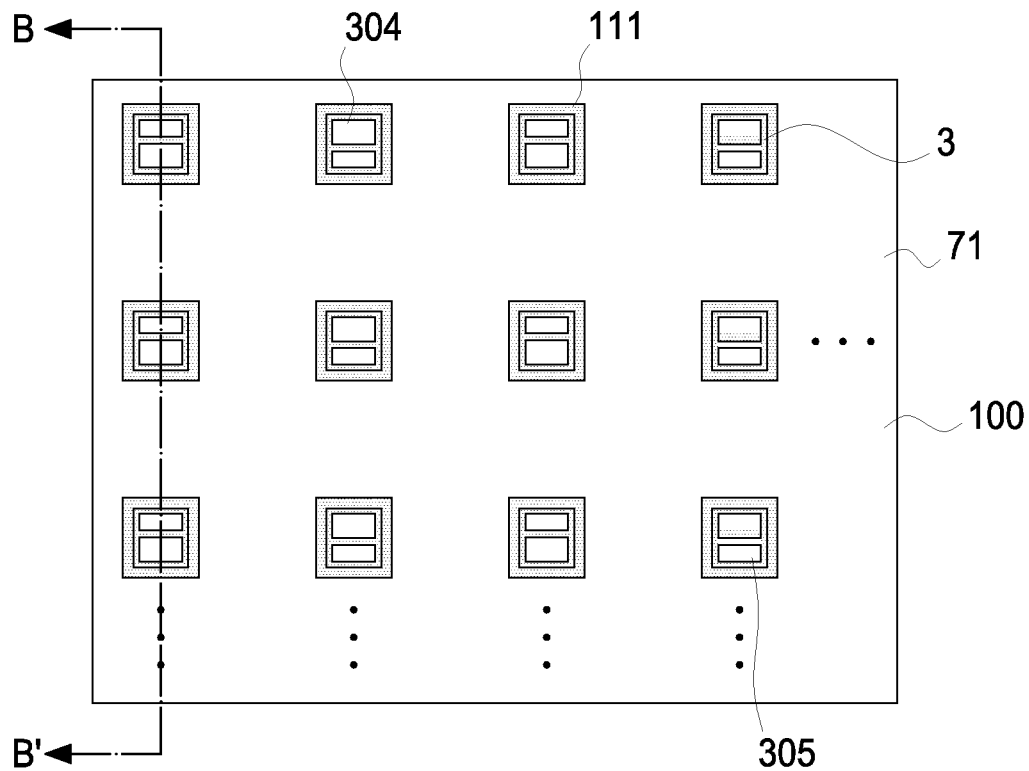
Figure 11B:
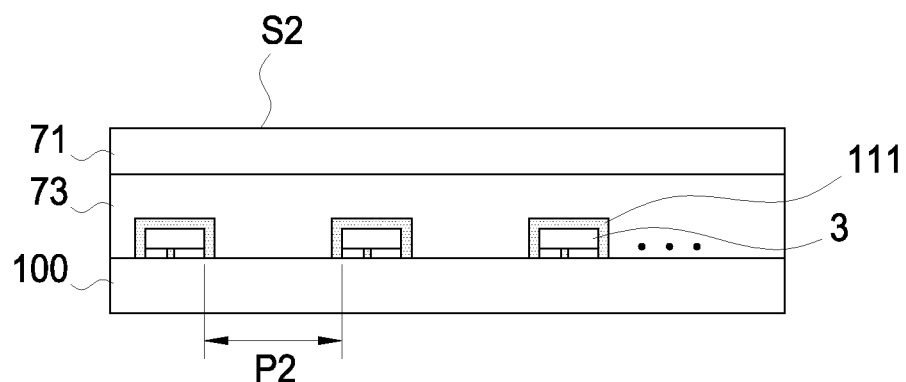
Figure 11C:
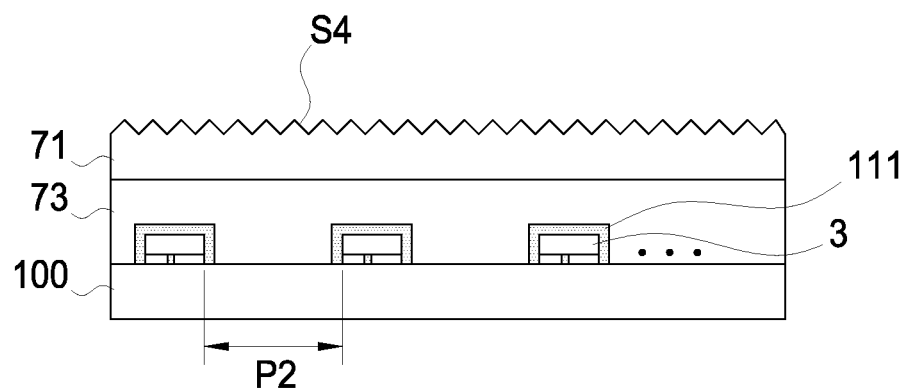
Figure 11D:
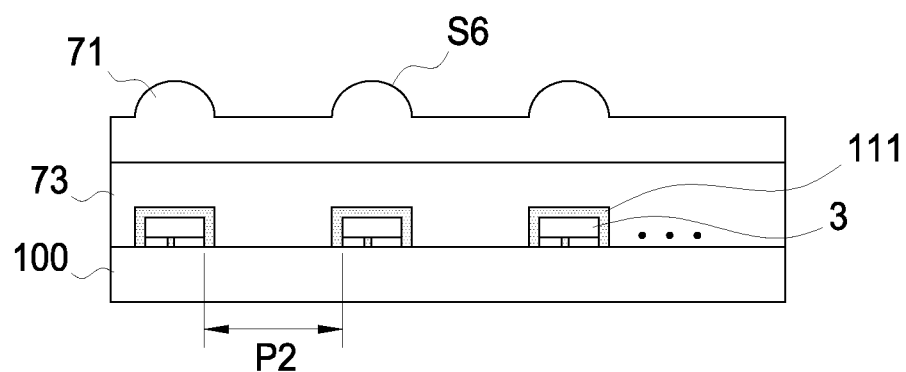

FIG. 11A illustrates a top view of several light-emitting units 3 with a first electrode pad 304 and a second electrode pad 305 formed thereon further supported by a second supporting structure 71 in accordance with an embodiment of the present application. FIG. 11B illustrates a cross-sectional view along line B-B' shown in FIG. 11A. The second supporting structure 71 can include one material different from that of the first supporting structure 73, or have hardness greater than that of the first supporting structure 73. The second supporting structure 71 can be made of one or more transparent materials, such as sapphire, diamond, glass, epoxy, quartz, acryl, $SiO_x$, $Al_2O_3$, ZnO, silicone, or any combination thereof. A thickness of the second supporting structure 71 can be between 100 μm and 700 μm. In addition, the second supporting structure 71 can also be transparent to light, like the sunlight. In addition, a wavelength converting layer 111 is formed around each optoelectronic unit 3. At least one surface of the second supporting structure 71 is a flat surface, such as the surface S2 shown in FIG. 11B; or a rough surface, such as the surface S4 shown in FIG. 11C; or the curved surface S6 shown in FIG. 11D. The surface S4 of the first supporting structure 73 is a zigzag surface. The curved surface S6 of the first supporting structure 73 has several curved protrusions respectively corresponding to the light-emitting units 3.

Figure 12A:
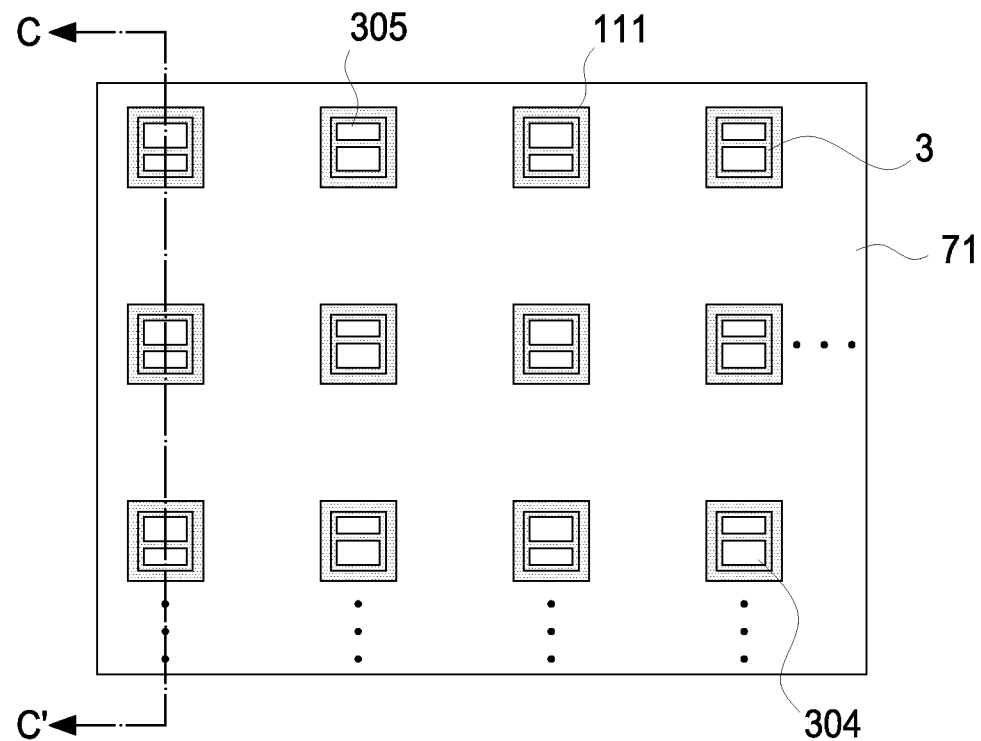
Figure 12B:
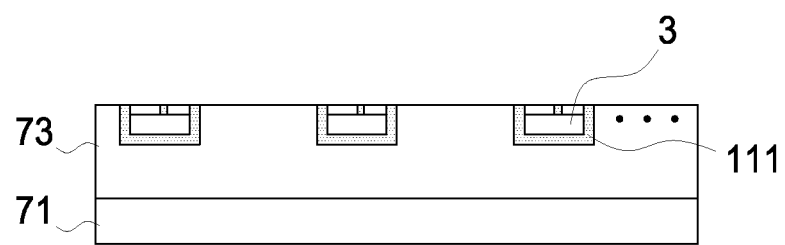

FIG. 12A illustrates a top view of several light-emitting units 3 supported by a second supporting structure 71 and a first supporting structure 73 in accordance with an embodiment of the present application. After the optoelectronic unit 3 is removed from a temporary carrier 100 shown in FIG. 11B, the second supporting structure 71 and the first supporting structure 73 are flipped. FIG. 12B illustrates a cross-sectional view along the line C-C' shown in FIG. 12A.

Figure 13A:
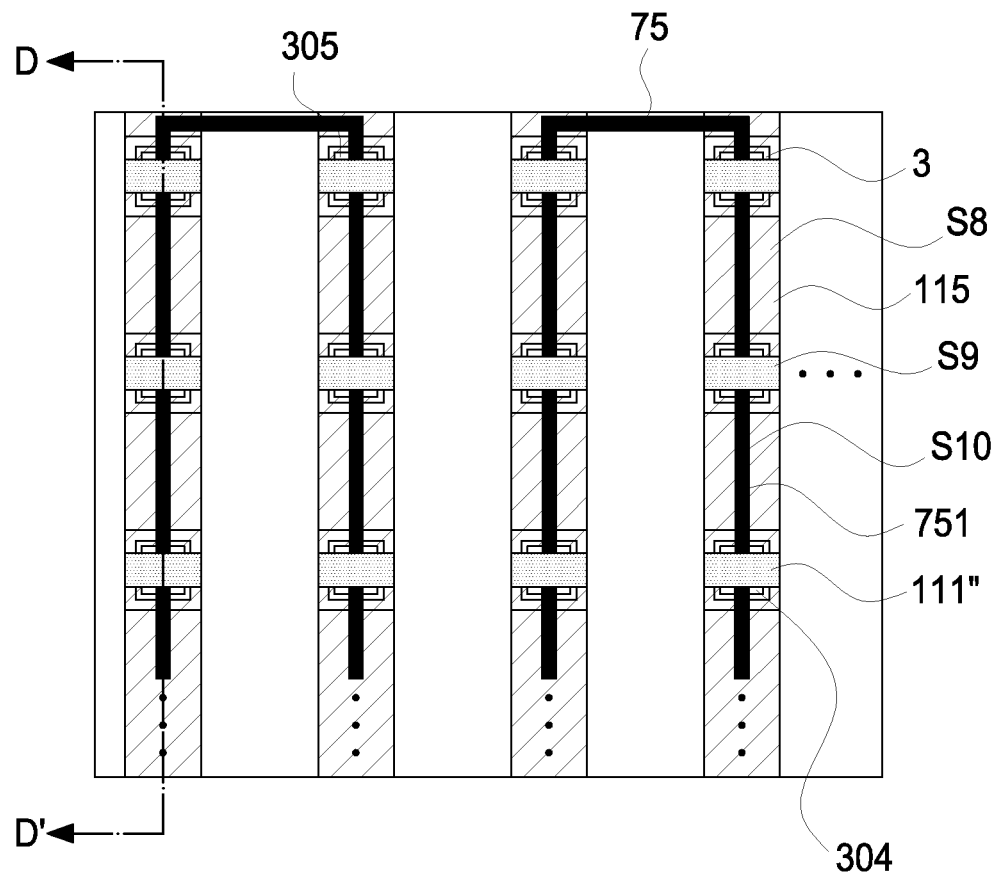
Figure 13B:
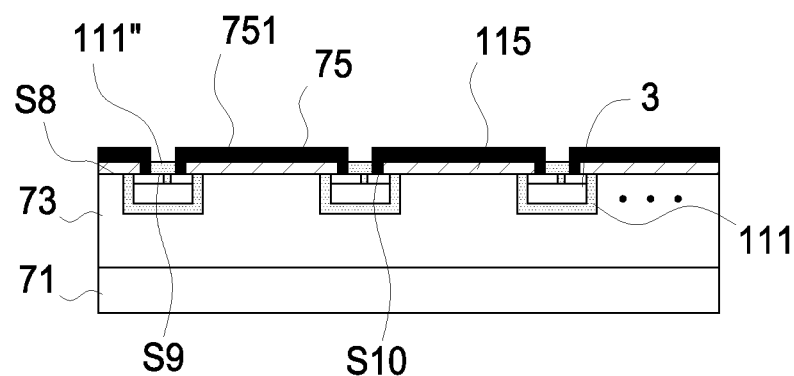

FIG. 13A and FIG. 14A illustrate top views of the light-emitting units 3 electrically connected by a conductive element 75 in series. In accordance with another embodiment, the light-emitting units 3 can be electrically connected by the conductive element 75 in parallel. FIG. 13B and FIG. 14B illustrate cross-sectional views along the line D-D' shown in FIG. 13A and the line E-E' shown in FIG. 14A, respectively. As shown in FIG. 13A and FIG. 14A, the conductive element 75 has a portion 751 arranged on the first supporting structure 73 between two of the light-emitting units 3. A reflective layer 115 is formed on the optoelectronic unit 3 by a lithography process and an etching process. The reflective layer 115 can be made of one or more reflective materials, such as dielectrically material, for example, $SiO_2$, $Si_3N_4$, or metal oxide, such as titanium dioxide or other white substance. In an example of the present application, the reflective layer 115 can be a single layer or a stack. FIGS. 13A-13B illustrate an embodiment that a part surface S8 of the first supporting structure 73 is covered by the reflective layer 115, a part of surface S9 of the first supporting structure 73 not covered by the reflective layer 115 is overlaid by a wavelength converting layer 111", and a part of surface S10 of the first supporting structure 73 not covered by the reflective layer 115 and the wavelength converting layer 111" is overlaid by the conductive element 75. The reflective layer 115 is formed on the first supporting structure 73 between two of the light-emitting units 3. The materials of the wavelength converting layer 111" and the wavelength converting layer 111 can be the same or different. The material of the conductive element 75 includes one or more metals. The metal is such as Ag, Au, Ti, or Cu.

FIGS. 14A-14B illustrate another embodiment that a part of the surface S8 of the first supporting structure 73 is covered by the reflective layer 115, and a part of surface S10 of the first supporting structure 73 not covered by the reflective layer 115 is overlaid by the conductive element 75.

After the steps illustrated in FIGS. 8A-14B are finished, the light-emitting units 3 are electrically connected with each other in series by the conductive element 75, as shown in FIG. 15. In another embodiment, the light-emitting units 3 can be electrically connected with each other in parallel (not shown) by the conductive element 75. As shown in FIG. 15, a first terminal 76 and a second terminal 78 are formed on the same end of a first supporting structure 73 as electrical contact points. In another example of the embodiment, the first terminal 76 and the second terminal 78 can be formed on opposite ends of the first supporting structure 73 as electrical contact points. After forming the first terminal 76 and the second terminal 78, the light-emitting units 3 connected by the conductive element 75 are separated into several light-emitting devices 7f, as shown in FIG. 16. However, the number of the light-emitting units 3 can be adjusted depending on the application. The light-emitting units 3 can be disposed in single line or multiple lines, for example, two lines as shown in FIG. 16. At least one of the light-emitting devices 7*f* has a width W and a length L. The width W is approximately between 100 μm and 1000 μm. The length L depends on the amount of the connected light-emitting units 3. The more the connected optoelectronics units are, the longer the length L is.

In another embodiment of the present application, the first terminal 76 and the second terminal 78 are formed on opposite ends of the first supporting structure 73 as electrical contact points, as shown in FIG. 17. The light-emitting units 3 are disposed in single line. At least one of light-emitting devices 7*g* has a width W and a length L. For example, the width W is approximately between 100 μm and 1000 μm. The length L depends on the amount of the connected light-emitting units 3. The more the connected optoelectronics units are, the longer the length L is.

The light-emitting device 7*f* or 7*g* of the present application can be constructed and arranged for different uses, for example, light bulb, emergency light, PAR light, automotive light, street lighting, subway lighting or indoor lighting. In accordance with an embodiment of the present application, the light-emitting device 7*f* or 7*g* can be applied to a bulb, such as the light bulb 6 shown in FIG. 7. Specifically, the light-emitting device 7*f* or 7*g* can be plugged into the socket 65 of the light bulb 6.

Figure 18:
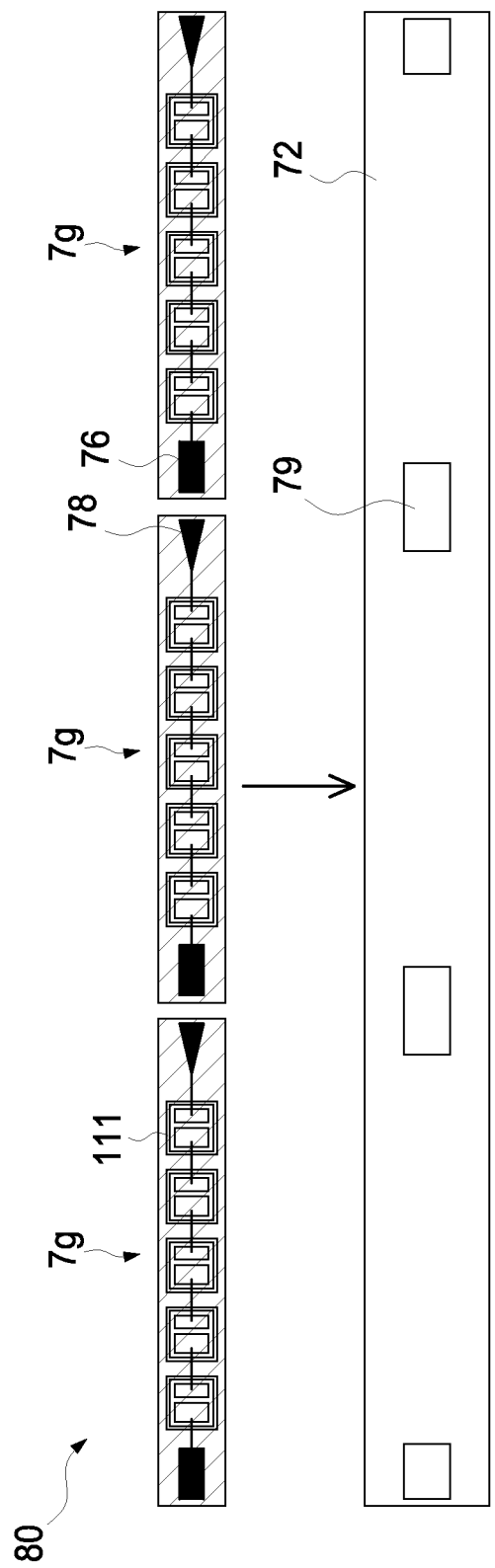
FIG. 18 illustrates a top view of an optoelectronic package in accordance with an embodiment of the present application.

In accordance with another embodiment of the present application, several light-emitting device 7*f* or 7*g* can be electrically connected with each other in a linear type. Taking the light-emitting device 7*g* as an example, FIG. 18 illustrates that the light-emitting devices 7*g* can be further mounted on a circuit board 72, such as a FR4 PCB. The assembly of the light-emitting devices 7*g* and the circuit board 72 is designated as a light-emitting device 80. The circuit board 72 can include a plurality of electrical connecting points 79 for connecting with an AC power (not shown). The first terminal 76 and the second terminal 78 are connected to the electrical connecting points 79 to form electrical connection.

Figure 19:
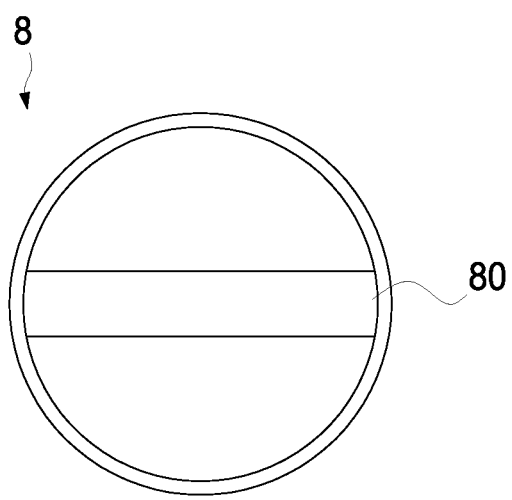
FIG. 19 illustrates a cross-sectional view of a light tube in accordance with an embodiment of the present application.

The light-emitting device 80 can be applied to a light tube 8. FIG. 19 illustrates a cross-sectional view of a light tube 8. The light tube 8 can have a size compatible with standard fluorescent tube, such as T5 and T8 fluorescent tube. The light tube 8 can include at least one light-emitting device 80, which is connected to a contact member (not shown) having a driver inside for electrical connection with an electrical power source (not shown). The driver (not shown) inside the contact member includes circuits for electrical rectification and overload protection.

Figure 20A:
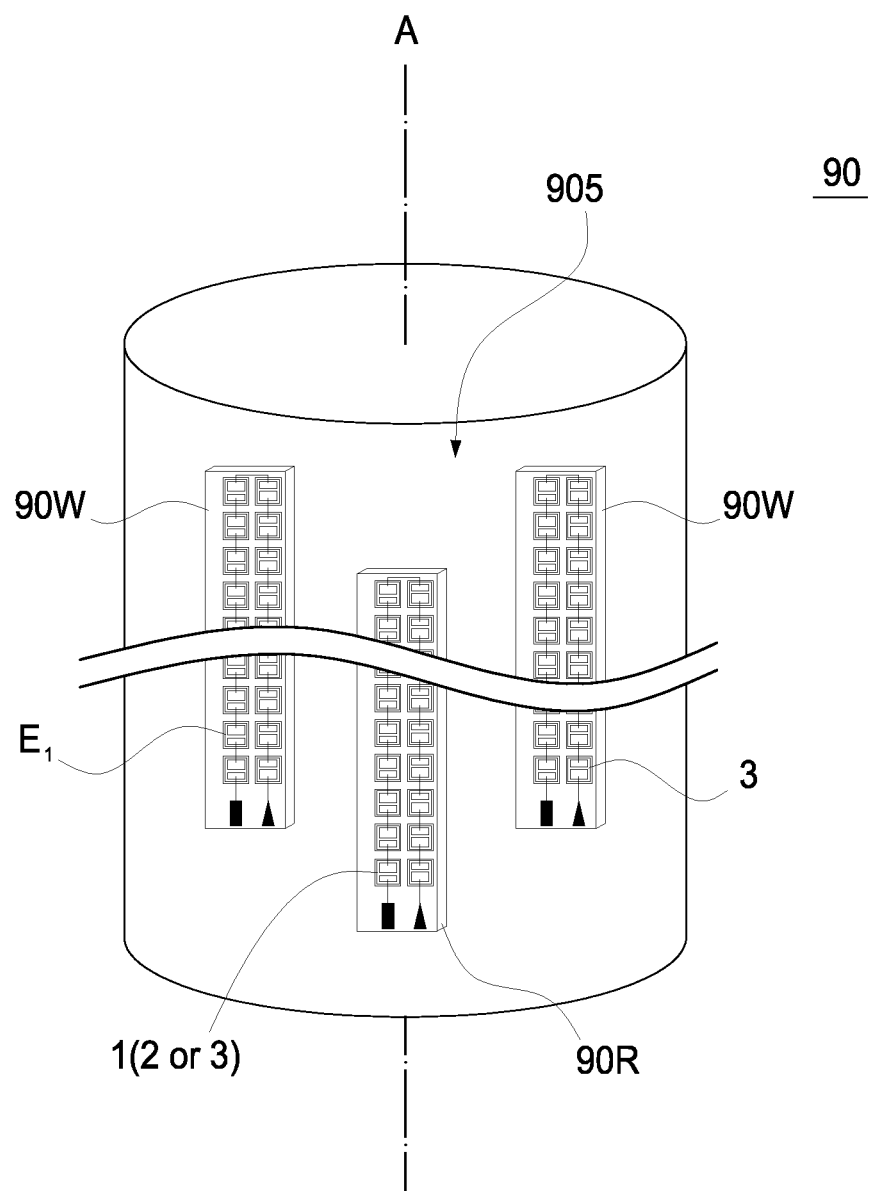
FIGS. 20A-20B illustrate an enlarged perspective view of a light tube in accordance with an embodiment of the present application.
Figure 20B:
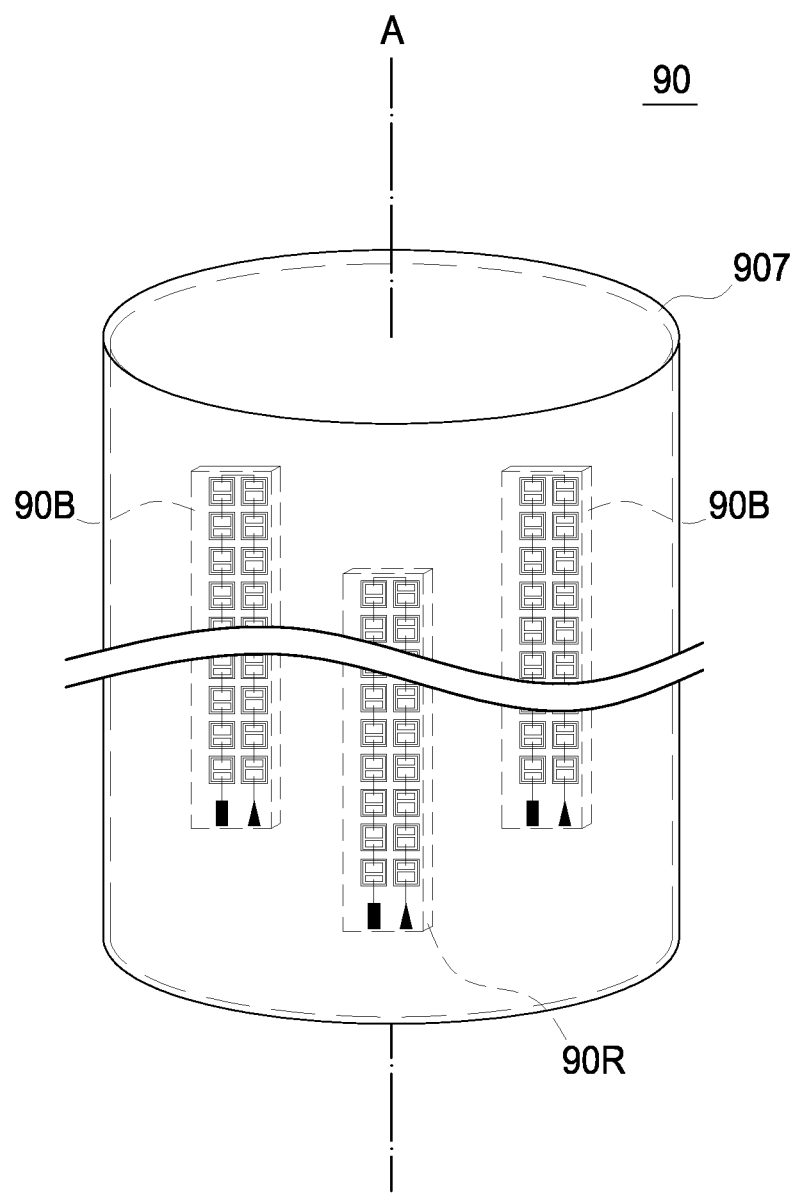

FIG. 20A illustrates an enlarged perspective view of an example of a light tube 90 in accordance with an embodiment of the present application. The example of FIG. 20A illustrates the light tube 90 having a cylinder shape. The light tube 90 comprises a hollow chamber 905, a light-emitting device 90R capable of emitting a red light and two light-emitting devices 90W capable of emitting a white light. The light-emitting device 90R and the light-emitting device 90W are disposed within the hollow chamber 905. The hollow chamber 905 comprises rectangular shape, cylinder shape, U-shape, or arc shape. The hollow chamber 905 can be filled with air or transparent medium such as silicone or epoxy. Depending on the actual requirement, numbers of the light-emitting device 90W and the light-emitting device 90R can be varied to obtain a desired color temperature. The light-emitting device 90R and the light-emitting device 90W are arranged around a central axis (A) and parallel to each other. In FIGS. 20A-20B, the optoelectronic unit 3 is referred in the following description, but one or more kinds of the light-emitting units 1, 2, or 3, or the optoelectronic elements 4*a*, 4*b*, or 4*c* described above can be applied to the light-emitting device 90R and the light-emitting device 90W. Each of the light-emitting device 90R and the light-emitting device 90W has a structure similar to that of the light-emitting device 7*g* or 7*f* shown in FIGS. 16-17. The light-emitting device 90R or the light-emitting device 90W comprises a plurality of light-emitting units 3 connected in series to each other. A manufacture method of the light-emitting device 90R and the light-emitting device 90W can be referred to the embodiments illustrates in FIGS. 8A-17. In this embodiment, the light-emitting device 90W comprises a plurality of light-emitting units 3 capable of emitting a blue light, and a wavelength converting layer directly formed on the light-emitting units 3 to convert the blue light to a yellow light. The blue light is mixed with the yellow light to produce a white light. The light tube 90 can be configured to mix light. Specifically, the white light emitted from the light-emitting device 90W and having a CRI value less than 80 is mixed with the red light emitted from the light-emitting device 90R for obtaining a white light having a CRI value greater than 80. In this embodiment, since the light-emitting device 90W and the light-emitting device 90R are separated from each other, the heat conduction between the light-emitting device 90W and the light-emitting device 90R can be reduced. The material of the light tube 90 comprises glass, silica gel, PMMA, PU, or epoxy. Furthermore, since the light-emitting device 90W and the light-emitting device 90R are separated from each other, the light-emitting device 90W and the light-emitting device 90R can be separately controlled in two channels by an IC circuit. Two channels indicate the light-emitting device 90W and the light-emitting device 90R are configurable to be driven under the same or different current. For example, when the light-emitting device 90W is driven under 30 mA, the light-emitting device 90R can be optionally driven under 30 mA or 20 mA. Alternatively, the light-emitting device 90W and the light-emitting device 90R can be connected in series and controlled in one channel through a circuit design on a circuit board. One channel indicates the light-emitting device 90W and the light-emitting device 90R are driven under the same current. For example, when the light-emitting device 90W is driven under 20 mA, the light-emitting device 90R is also driven under 20 mA.

FIG. 20B illustrates an enlarged perspective view of another example of a light tube 90. In the example, the light tube 90 comprises one light-emitting device 90R capable of emitting a red light and two light-emitting devices 90B capable of emitting a blue light. A film layer 907 comprising wavelength converting materials and diffusing particles is formed on an inner surface of the light tube 90. Alternatively, the film layer 907 can be formed on an outer surface of the light tube 90. The wavelength converting materials are adopted for converting the blue light emitting from the light-emitting device 90B into a yellow light. The blue light is mixed with the yellow light to produce a white light. The diffusing particles are adopted for diffusing the blue light, the yellow light and/or the white light. The white light mixed by the blue light and the yellow light usually has a CRI value less than 80, and then is further mixed with the red light emitted from the light-emitting device 90R for obtaining a white light having a CRI value greater than 80. In one embodiment, the film layer 907 comprises the wavelength converting materials for converting light and diffusing light.

Figure 21A:
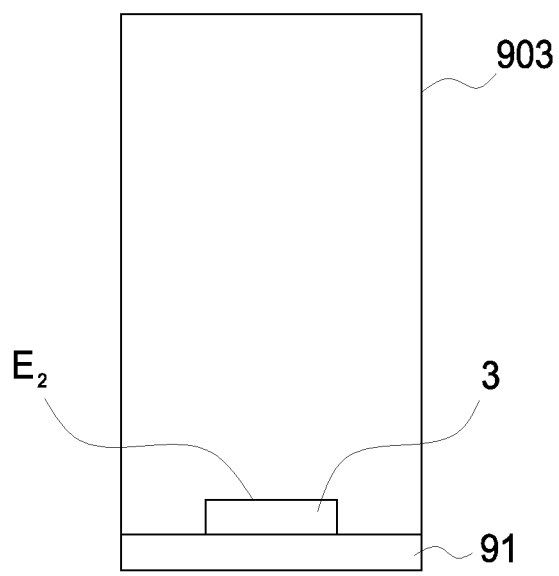
FIGS. 21A-21B illustrate a cross-sectional view of a light-emitting device in accordance with an embodiment of the present application.
Figure 21B:
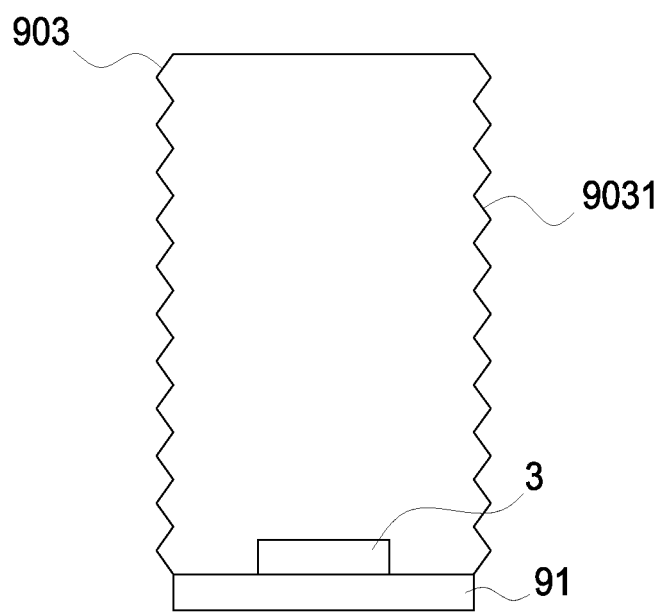

FIG. 21A illustrates a cross-sectional view of a light-emitting device 90R. As shown in FIG. 21A, the light-emitting device 90R has a structure different from the example of the light-emitting device 90R shown in FIG. 20A. In FIGS. 21A-21B, the optoelectronic unit 3 is referred in the following description, but one or more kinds of the light-emitting units 1, 2, or 3, or the optoelectronic elements 4a, 4b, or 4c described above can be applied to the light-emitting device 90R. As shown in FIG. 21A, the light-emitting device 90R comprises the optoelectronics units 3 disposed on a circuit board 91 and a cover 903 disposed over the light-emitting units 3 for guiding or scattering light. The light-emitting device 90R in the example of FIG. 20A has an emanating side E1 perpendicular to the central axis (A). The light-emitting device 90R in the example of FIG. 21A illustrates that the light-emitting device 90R has an emanating side E2 parallel to the central axis (A) shown in FIG. 20A. FIG. 21B illustrates a cross-sectional view of another example of the light-emitting device 90R. As shown in FIG. 21B, the cover 903 can be roughed at the side surfaces 9031 for improving light extraction in another example of the embodiment.

Figure 22A:
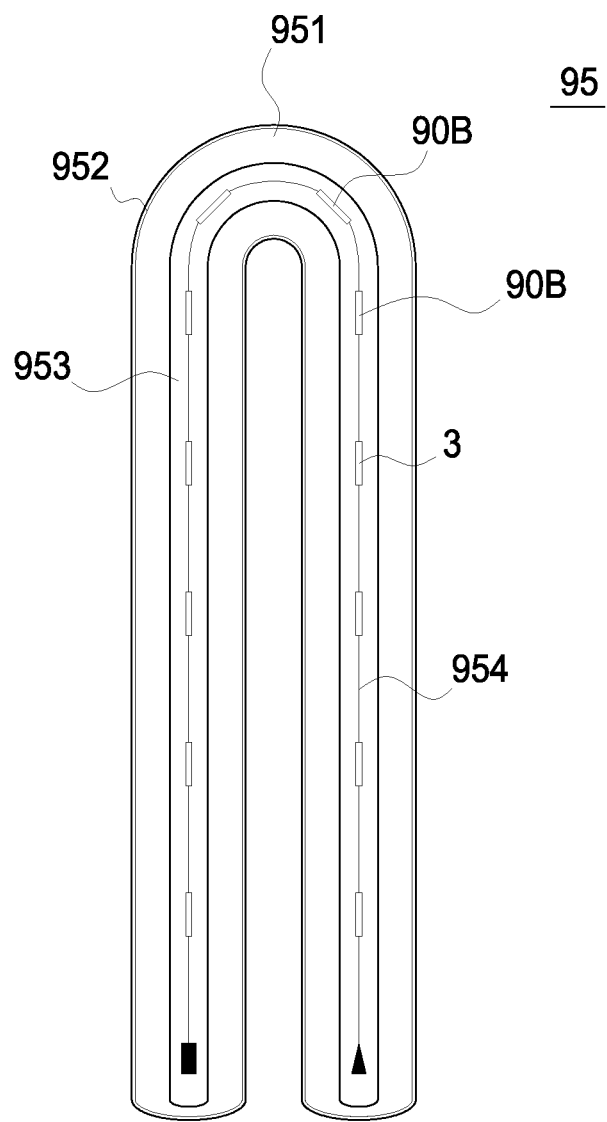
FIGS. 22A-22B illustrate a cross-sectional view of a light tube in accordance with an embodiment of the present application.
Figure 22B:
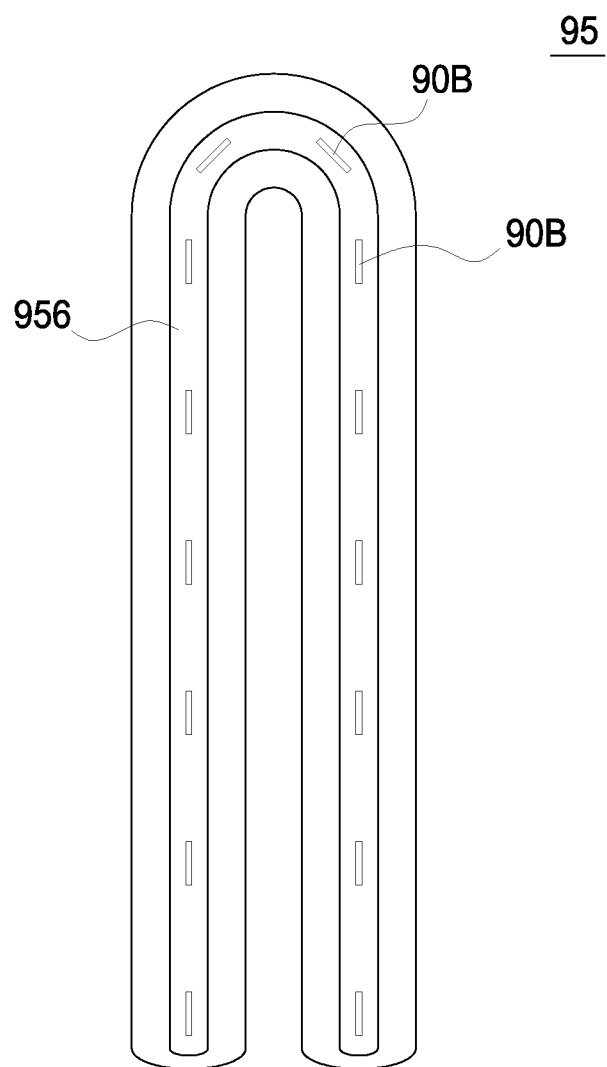

FIG. 22A illustrates a perspective view of an example of a light tube 95 in accordance with an embodiment of the present application. FIG. 22A illustrates an example that the light tube 95 have a U-shape. As shown in FIG. 22A, the light tube 95 comprises a light-transmissive cover 951, and the light-emitting device 90B capable of emitting a blue light and disposed within the light-transmissive cover 951. In FIGS. 22A-22B, the optoelectronic unit 3 is referred in the following description, but one or more kinds of the light-emitting units 1, 2, or 3, or the optoelectronic elements 4a, 4b, or 4c described above can be applied to the light-emitting device 90B. As shown in FIG. 22A, the light-emitting device 90B comprises a plurality of light-emitting units 3 connected in series to each other and formed on a flexible transparent substrate 953 and are electrically connected in series with each other via a connecting structure 954 such as wire. In one embodiment, the bent light tube 95 can comprise the light-emitting device 90B capable of emitting a blue light and the light-emitting device 90R capable emitting a red light. In addition, a film layer 952 can be formed on an inner surface and/or an outer surface of the light-transmissive cover 951. The film layer 952 comprises wavelength converting materials and diffusing particles. The wavelength converting materials are adopted for converting the blue light into a yellow light. The blue light is mixed with the yellow light to produce a white light. The diffusing particles are adopted for diffusing the blue light, the yellow light and/or the white light. The white light mixed by the blue light and the yellow light usually has a CRI value less than 80, and then is further mixed with the red light emitted from the red light-emitting units for obtaining a white light having a CRI value greater than 80. In one embodiment, the film layer 952 comprises the wavelength converting materials for converting light and diffusing light.

FIG. 22B illustrates a perspective view of another example of a light tube 95. As shown in FIG. 22B, a plurality of the light-emitting devices 90B can be mounted on a U-shaped flexible substrate 956. The flexible substrate 956 has a circuit (not shown) thereon for electrically connecting the light-emitting devices 90B. The structure of light-emitting devices 90B comprising a plurality of light-emitting units, for example, the optoelectronic unit 3 described above electrically connected in series to each other is similar to the structure of the light-emitting device 7g or 7f shown in FIGS. 16-17.

Figure 23:
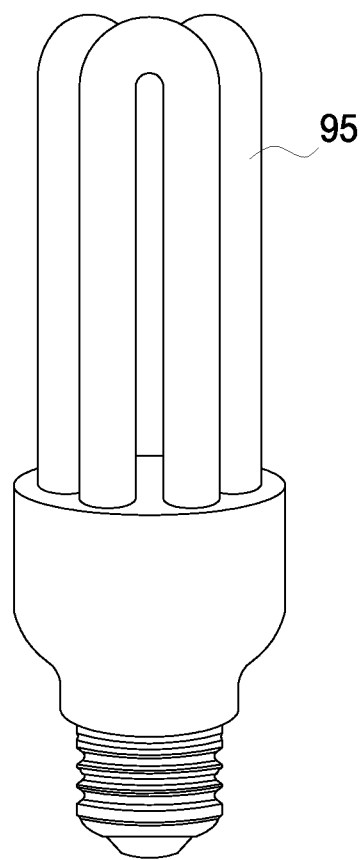
FIG. 23 illustrates a perspective view of a light bulb in accordance with an embodiment of the present application.

FIG. 23 illustrates a perspective view of a light bulb 20 in accordance with an embodiment of the present application. The light bulb 20 comprises three bent light tubes 95 (U-shaped).

Figure 24:
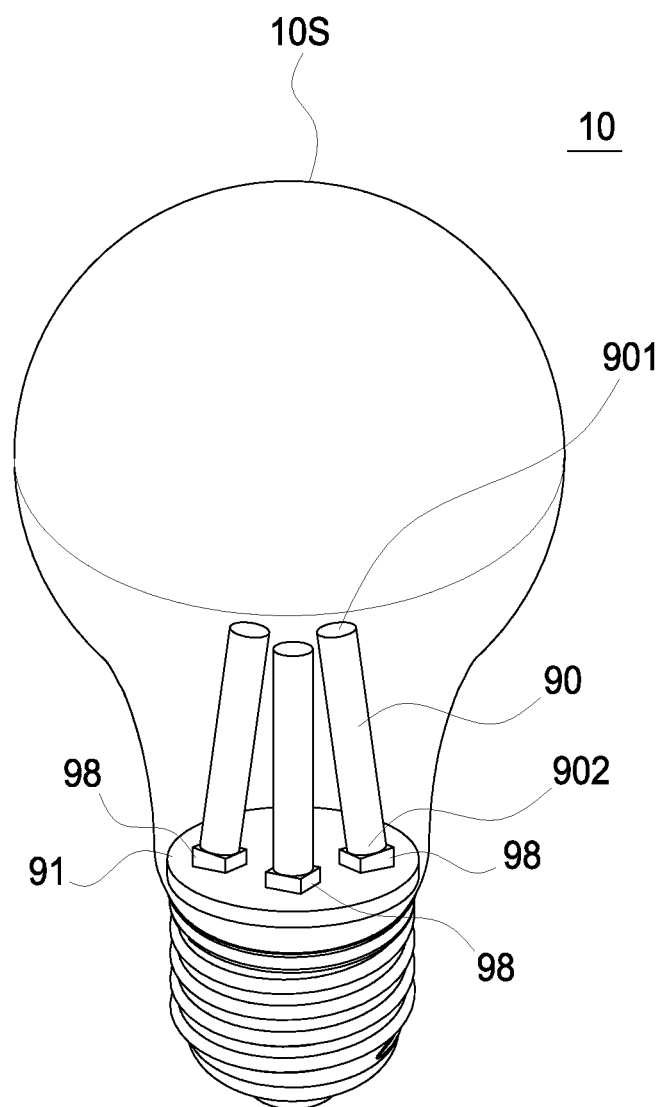
FIG. 24 illustrates a perspective view of a light bulb in accordance with an embodiment of the present application.

FIG. 24 illustrates a perspective view of a light bulb 10 in accordance with an embodiment of the present application. The light bulb 10 comprises a bulb cover 10S, a circuit board 91 such as PCB, a plurality of sockets 98 mounted on and electrically connected with the circuit board 91, and a plurality of light tubes 90 detachably coupled to the corresponding socket 98. The light tubes 90 are arranged in a triangular pattern and tilted to each other. Specifically, the light tubes 90 are arranged in a cone shape viewed from perspective. Since the socket 98 has a tilted top surface, the light tube 90 connected into the tilted top surface has a tilted position. Therefore, top portions 901 of the light tubes 90 are close to each other and bottom portions 902 of the light tubes 90 are far away from each other. Alternatively, top portions 901 of the light tubes 90 can be far away from each other and bottom portions 902 of the light tubes 90 are close to each other. In one embodiment, the light tubes 90 can be arranged in a polygon pattern such as a square or a hexagon and emit light outwardly. The light tubes 90 can also be arranged parallel to each other.

Figure 25:
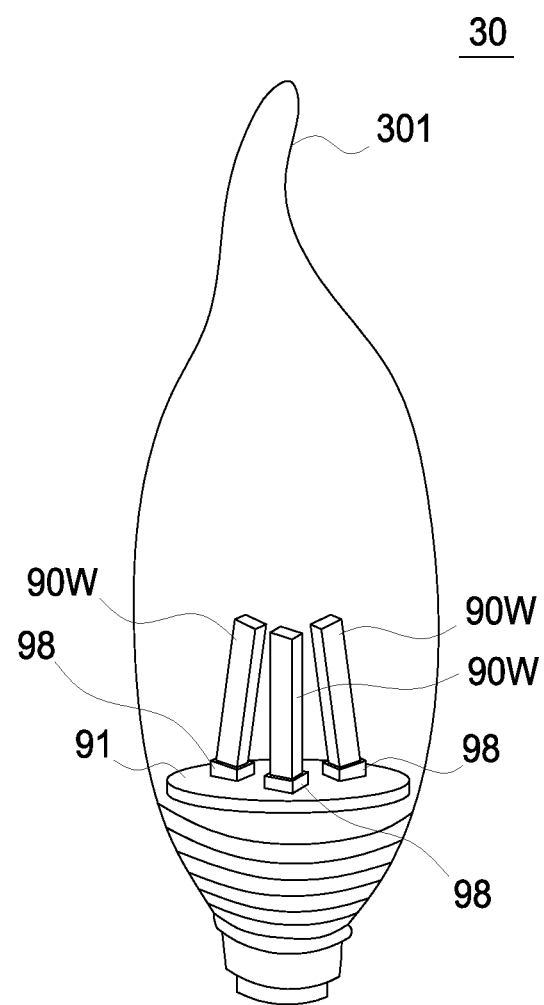
FIG. 25 illustrates a perspective view of a light bulb in accordance with an embodiment of the present application.

FIG. 25 illustrates a perspective view of a light bulb 30 in accordance with an embodiment of the present application. The light bulb 30 comprises a candle light cover 301, a circuit board 91 such as PCB, a plurality of sockets 98 mounted on and electrically connected with the circuit board 91, and a plurality of light-emitting devices 90W capable of emitting a white light detachably coupled to the corresponding socket 98. The light-emitting devices 90W are arranged in a triangular pattern and tilted to each other. In this embodiment, since the socket 98 has a tilted top surface, the light-emitting devices 90W connected into the tilted top surface has a tilted position. Therefore, top portions of the light-emitting devices 90W can be close to each other and bottom portions of the light-emitting devices 90W are far away from each other. Alternatively, top portions of the light-emitting devices 90W can be far away from each other and bottom portions of the light-emitting devices 90W are close to each other. In one embodiment, the light-emitting devices 90W can be arranged parallel to each other. The light-emitting devices 90W can be arranged in a polygon pattern such as a square or a hexagon and emit light outwardly. The light-emitting device 90W can also be arranged parallel to each other. In this embodiment, the light-emitting device 90W has a structure similar to that of the light-emitting device 7g or 7f shown in FIGS. 16-17.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

The invention claimed is:
1. A light bulb, comprising:
a base;
a plurality of optoelectronic units, each of the plurality of optoelectronic units comprising a side surface, a first semiconductor layer, a second semiconductor layer, and a light-emitting layer formed between the first semiconductor layer and the second semiconductor layer;
a first bonding pad and a second bonding pad formed on a top side of one of the plurality of optoelectronic units;

a third bonding pad and a fourth bonding pad formed on a top side of another of the plurality of optoelectronic units;

a plurality of conductive elements spaced apart from each other, wherein one of the plurality of conductive elements comprises a bottom surface directly connecting the first bonding pad formed on the one of the plurality of optoelectronic units and the third bonding pad formed on the another of the plurality of optoelectronic units without covering the side surfaces of the one and the another of the plurality of optoelectronic units, and a top surface opposite to the bottom surface;

a transparent structure continuously covering the plurality of optoelectronic units and the plurality of conductive elements without directly contacting the top surfaces of the plurality of conductive elements; and a light tube configured to accommodate the plurality of optoelectronic units, the plurality of conductive elements, and the transparent structure, and comprising a plurality of openings facing a same direction, the light tube being connected to the base.

2. The light bulb of claim 1, further comprising a wavelength converting material arranged within the transparent structure.

3. The light bulb of claim 2, wherein the wavelength converting material directly covers the one of the plurality of optoelectronic units.

4. The light bulb of claim 2, wherein the one of the plurality of optoelectronic units comprises a bottom side opposite to the top side, and the wavelength converting material is arranged under the bottom side, and covers the side surface.

5. The light bulb of claim 2, wherein each of the plurality of conductive elements comprises an outer side surface which is not covered by the transparent structure.

6. The light bulb of claim 5, further comprising another wavelength converting material arranged on the top side of the one of the plurality of optoelectronic units.

7. The light bulb of claim 6, wherein each outer side surface of the the plurality of conductive elements is not covered by the another wavelength converting material.

8. The light bulb of claim 1, wherein the light tube comprises a bending portion disposed farther from the base than the plurality of openings.

9. The light bulb of claim 1, wherein the light tube comprising a curved portion disposed farther from the base than the plurality of openings.

10. The light bulb of claim 1, wherein the light tube is not directly connected to the transparent structure.

11. The light bulb of claim 1, wherein each of the plurality of conductive elements has a length larger than a corresponding one of the plurality of optoelectronic units.

12. The light bulb of claim 1, wherein one of the plurality of openings has a cross-sectional area, the cross-sectional area is smaller than the base.

13. The light bulb of claim 1, wherein the transparent structure is formed in a stripe shape.

14. The light bulb of claim 1, wherein the transparent structure has a curved shape.

15. The light bulb of claim 1, wherein the transparent structure has a melting point higher than an operation temperature of the plurality of optoelectronic units.

16. The light bulb of claim 1, wherein the transparent structure directly contacts the side surface of each of the plurality of optoelectronic units.

17. The light bulb of claim 1, further comprising a socket connected to the base.

18. The light bulb of claim 1, wherein the plurality of optoelectronic units is embedded in the transparent structure.

19. The light bulb of claim 1, wherein the plurality of optoelectronic units is connected in series.

20. The light bulb of claim 1, wherein the plurality of optoelectronic units is connected in parallel.

* * * * *